United States Patent
Hatano et al.

(10) Patent No.: US 10,254,459 B2
(45) Date of Patent: Apr. 9, 2019

(54) CIRCULAR POLARIZING PLATE, WIDEBAND LAMBDA/4 PLATE, AND ORGANIC ELECTROLUMINESCENCE DISPLAY DEVICE

(71) Applicant: ZEON CORPORATION, Chiyoda-ku, Tokyo (JP)

(72) Inventors: Taku Hatano, Tokyo (JP); Kazuhiro Oosato, Tokyo (JP)

(73) Assignee: ZEON CORPORATION, Chiyoda-ku, Tokyo (JP)

( * ) Notice: Subject to any disclaimer, the term of this patent is extended or adjusted under 35 U.S.C. 154(b) by 0 days.

(21) Appl. No.: 15/511,641

(22) PCT Filed: Sep. 10, 2015

(86) PCT No.: PCT/JP2015/075757
§ 371 (c)(1),
(2) Date: Mar. 16, 2017

(87) PCT Pub. No.: WO2016/043124
PCT Pub. Date: Mar. 24, 2016

(65) Prior Publication Data
US 2017/0261668 A1 Sep. 14, 2017

(30) Foreign Application Priority Data
Sep. 17, 2014 (JP) .................. 2014-189301

(51) Int. Cl.
*G02B 5/30* (2006.01)
*G02B 27/28* (2006.01)
(Continued)

(52) U.S. Cl.
CPC ............. *G02B 5/3083* (2013.01); *G02B 1/08* (2013.01); *G02B 5/3025* (2013.01);
(Continued)

(58) Field of Classification Search
CPC ...... G02B 5/3083; G02B 1/08; G02B 5/3016; G02B 27/286; H01L 51/5284;
(Continued)

(56) References Cited

U.S. PATENT DOCUMENTS 4,680,353 A   7/1987  Ishihara et al.
4,997,898 A   3/1991  Ishihara et al.
(Continued)

FOREIGN PATENT DOCUMENTS

EP   0318833 B1   11/1993
JP   S62187708 A   8/1987
(Continued)

OTHER PUBLICATIONS

Machine translation of JP 2004-184575 from https://www4.j-platpat.inpit.go.jp/eng/tokujitsu/tkbs_en/TKBS_EN_GM301_Detailed.action, downloaded on May 24, 2018.*

(Continued)

*Primary Examiner* — Frank G Font
(74) *Attorney, Agent, or Firm* — Kenja IP Law PC

(57) ABSTRACT

A circularly polarizing plate includes: a polarizing film; a λ/2 plate having a slow axis in a direction forming an angle of 15°±5° with respect to an absorption axis of the polarizing film; and a λ/4 plate having a slow axis in a direction forming an angle of 75°±5° with respect to the absorption axis of the polarizing film, which are provided in this order. A wavelength dispersion of the λ/2 plate and a wavelength dispersion of the λ/4 plate approximately coincide with each other. A refractive index of one of the λ/2 plate and the λ/4 plate is nz≥nx>ny, and a refractive index of the other of the λ/2 plate and the λ/4 plate is nx>ny≥nz, where nx, ny and nz represent refractive indices in in-plane slow axis, in-plane fast axis, and thickness directions, respectively.

11 Claims, 1 Drawing Sheet

US 10,254,459 B2
Page 2

(51) Int. Cl.
*H01L 51/52* (2006.01)
*G02B 1/08* (2006.01)

(52) U.S. Cl.
CPC ........ *G02B 27/281* (2013.01); *H01L 51/5284* (2013.01); *G02B 5/3016* (2013.01)

(58) Field of Classification Search
CPC ..... G02F 2001/133541; G02F 1/13363; G02F 2001/133635; G02F 2001/133637; G02F 2001/133638
USPC ........ 359/489.07; 349/96, 98, 102, 117–121; 313/112
See application file for complete search history.

(56) References Cited

U.S. PATENT DOCUMENTS

| | | | |
|---|---|---|---|
| 5,834,565 A | 11/1998 | Tracy et al. | |
| 6,400,433 B1 | 6/2002 | Arakawa et al. | |
| 6,593,984 B2 | 7/2003 | Arakawa et al. | |
| 6,853,423 B2 | 2/2005 | Arakawa et al. | |
| 7,354,632 B2 | 4/2008 | Murakami et al. | |
| 7,906,184 B2 | 3/2011 | Umemoto et al. | |
| 8,314,908 B2 | 11/2012 | Sakai | |
| 8,416,377 B2 | 4/2013 | Sakai | |
| 2006/0001799 A1* | 1/2006 | Kawamoto | G02B 5/3016 349/96 |
| 2007/0139773 A1* | 6/2007 | Kawamoto | G02B 5/3016 359/487.05 |
| 2007/0222919 A1* | 9/2007 | Chiba | G02B 5/3025 349/96 |
| 2008/0291389 A1* | 11/2008 | Kawamoto | G02B 5/3016 349/194 |
| 2009/0040434 A1* | 2/2009 | Kawamoto | G02B 5/3016 349/96 |
| 2009/0059143 A1* | 3/2009 | Shutou | G02B 5/3016 349/119 |
| 2009/0122236 A1* | 5/2009 | Shutou | G02F 1/13363 349/96 |
| 2009/0135343 A1* | 5/2009 | Kitamura | G02B 5/3033 349/96 |
| 2010/0045910 A1* | 2/2010 | Bitou | G02B 5/305 349/118 |
| 2010/0225855 A1* | 9/2010 | Lu | G02F 1/133555 349/96 |
| 2014/0375935 A1* | 12/2014 | Yamada | G02B 5/3025 349/103 |
| 2016/0085101 A1* | 3/2016 | Saitoh | G02F 1/133536 349/71 |

FOREIGN PATENT DOCUMENTS

| | | |
|---|---|---|
| JP | H01146912 A | 6/1989 |
| JP | H01178505 A | 7/1989 |
| JP | H11302529 A | 11/1999 |
| JP | 2000284126 A | 10/2000 |
| JP | 2001004837 A | 1/2001 |
| JP | 2001249222 A | 9/2001 |
| JP | 2003014931 A | 1/2003 |
| JP | 2003195041 A | 7/2003 |
| JP | 2004184575 A | 7/2004 |
| JP | 2005284024 A | 10/2005 |
| JP | 2007004120 A | 1/2007 |
| JP | 2010256900 A | 11/2010 |
| JP | 2011248045 A | 12/2011 |
| JP | 2012226996 A | 11/2012 |
| WO | 03102639 A1 | 12/2003 |

OTHER PUBLICATIONS

Dec. 15, 2015, International Search Report issued in the International Patent Application No. PCT/JP2015/075757.

Mar. 21, 2017, International Preliminary Report on Patentability issued in the International Patent Application No. PCT/JP2015/075757.

* cited by examiner

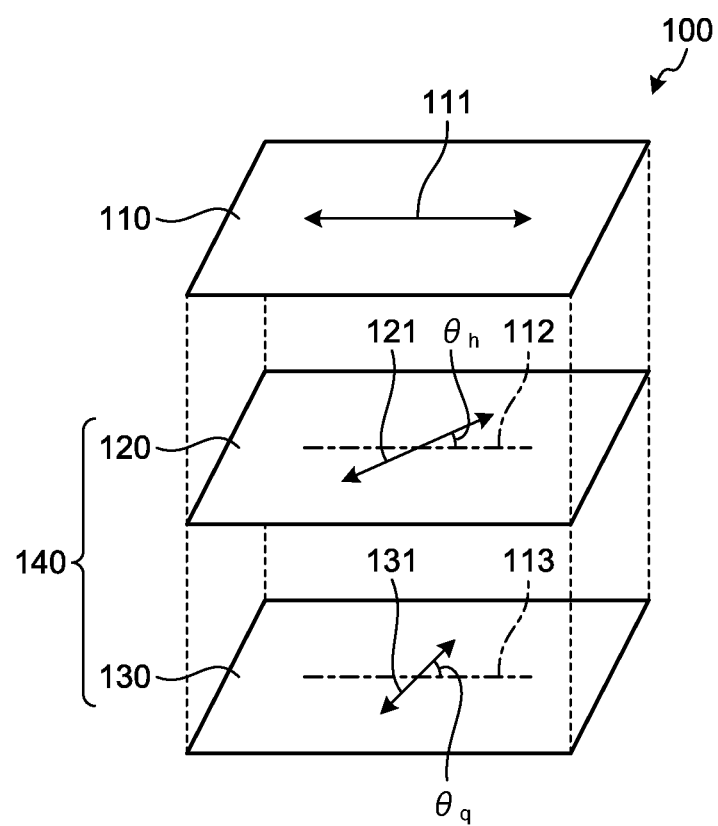

CIRCULAR POLARIZING PLATE, WIDEBAND LAMBDA/4 PLATE, AND ORGANIC ELECTROLUMINESCENCE DISPLAY DEVICE

FIELD

The present invention relates to a circularly polarizing plate and a broadband λ/4 plate, as well as an organic electroluminescent display device including the circularly polarizing plate and the broadband λ/4 plate.

BACKGROUND

Conventionally, a circularly polarizing plate has been provided to an organic electroluminescent display device (hereinafter, may be appropriately referred to as an "organic EL display device") for reducing reflection of outside light on a display surface in some cases. In general, a film obtained by combining a polarizing film and a λ/4 plate is used as such a circularly polarizing plate. However, most of conventional λ/4 plates were capable of actually achieving a phase difference of an approximately quarter wavelength only with light in a specific narrow wavelength range. Therefore, although reflection of outside light in a specific narrow wavelength range can be reduced by the circularly polarizing plate, reduction of reflection of other outside light was insufficient.

To deal with this, a broadband λ/4 plate obtained by combining a λ/4 plate and a λ/2 plate has been recently proposed (see Patent Literatures 1 to 6).

CITATION LIST

Patent Literature

Patent Literature 1: International Publication No. 2003/102639 A
Patent Literature 2: Japanese Patent Application Laid-Open No. 2005-284024A
Patent Literature 3: Japanese Patent Application Laid-Open No. 2000-284126A
Patent Literature 4: Japanese Patent Application Laid-Open No. 2001-004837A
Patent Literature 5: Japanese Patent Application Laid-Open No. 2003-014931A
Patent Literature 6: Japanese Patent Application Laid-Open No. 2003-195041A

SUMMARY

Technical Problem

With the broadband λ/4 plates described in Patent Literatures 1 to 6, a phase difference of an approximately quarter wavelength for light in a wide wavelength range can be achieved. Therefore, a circularly polarizing plate that can reduce reflection of outside light in a wide wavelength range can be achieved.

In a circularly polarizing plate obtained by combining a polarizing film and the broadband λ/4 plate, directions of optical axes including an absorption axis of a polarizing film a slow axis of a λ/2 plate, and a slow axis of a λ/4 plate are required to be adjusted such that these optical axes form specific angles.

However, when the circularly polarizing plate is observed from a tilt direction other than a front direction, apparent angles formed by the above-mentioned optical axes may deviate from the specific angles in some cases. As a result, while a conventional circularly polarizing plate is capable of reducing reflection of outside light in a front direction, it may be incapable of effectively reducing reflection of outside light in a tilt direction other than the front direction in some cases. In particular, since the circularly polarizing plate including the broadband λ/4 plate includes not only the λ/4 plate but also the λ/2 plate, the number of optical axes is larger than that of a conventional circularly polarizing plate. Therefore, in the circularly polarizing plate including the broadband λ/4 plate, the deviation of apparent optical axes is larger than that of a conventional circularly polarizing plate which does not include the λ/2 plate, and the ability to reduce reflection of outside light in a tilt direction tends to be degraded.

The present invention has been created in view of the above-described problems, and it is an object of the present invention to provide: a circularly polarizing plate that can effectively reduce reflection of outside light in both a front direction and a tilt direction; a broadband λ/4 plate capable of achieving the circularly polarizing plate that can effectively reduce reflection of outside light in both a front direction and a tilt direction; and an organic electroluminescent display device including the above-described circularly polarizing plate or broadband λ/4 plate.

Solution to Problem

The present inventor intensively conducted research for solving the above-mentioned problem. As a result, the present inventor has found that when a combination of the following (1) to (3) is satisfied by a circularly polarizing plate including a polarizing film, a λ/2 plate, and a λ/4 plate in this order, reflection of outside light can be effectively reduced in both a front direction and a tilt direction.

(1) The angle formed by the absorption axis of the polarizing film and the slow axis of the λ/2 plate is confined within a specific range, and the angle formed by the absorption axis of the polarizing film and the slow axis of the λ/4 plate is confined within a specific angle.

(2) The wavelength dispersion of the λ/2 plate and the wavelength dispersion of the λ/4 plate approximately coincide with each other.

(3) A refractive index of one of the λ/2 plate and the λ/4 plate is set to nz≥nx>ny, and a refractive index of the other of the λ/2 plate and the λ/4 plate is set to nx>ny≥nz.

The present invention was achieved on the basis of such findings.

That is, the present invention is as follows.

(1) A circularly polarizing plate comprising:
a polarizing film;
a λ/2 plate having a slow axis in a direction forming an angle of 15°±5° with respect to an absorption axis of the polarizing film; and
a λ/4 plate having a slow axis in a direction forming an angle of 75°±5° with respect to the absorption axis of the polarizing film, which are provided in this order, wherein
a wavelength dispersion of the λ/2 plate and a wavelength dispersion of the λ/4 plate approximately coincide with each other, and
when a refractive index in an in-plane slow axis direction is represented by nx, a refractive index in an in-place fast axis direction is represented by ny, and a refractive index in a thickness direction is represented by nz, a refractive index of one of the λ/2 plate and the λ/4 plate is nz≥nx>ny, and a refractive index of the other of the λ/2 plate and the λ/4 plate is nx>ny≥nz.

(2) The circularly polarizing plate according to (1), satisfying the following formula (A):

|Reh(400)/Reh(550)−Req(400)/Req(550)|<1.00 wherein Reh(400) is an in-plane phase difference of the λ/2 plate at a wavelength of 400 nm, Reh(550) is an in-plane phase difference of the λ/2 plate at a wavelength of 550 nm, Req(400) is an in-plane phase difference of the λ/4 plate at a wavelength of 400 nm, and Req(550) is an in-plane phase difference of the λ/4 plate at a wavelength of 550 nm.

(3) The circularly polarizing plate according to (1) or (2), wherein an NZ factor of one of the λ/2 plate and the λ/4 plate is −0.5 to 0.0, and an NZ factor of the other of the λ/2 plate and the λ/4 plate is 1.0 to 1.3.

(4) The circularly polarizing plate according to any one of (1) to (3), wherein one of the λ/2 plate and the λ/4 plate includes a layer formed of a resin containing polyphenylene ether and a polystyrene-based polymer having a syndiotactic structure.

(5) The circularly polarizing plate according to (4), wherein a weight ratio of the polyphenylene ether to the polystyrene-based polymer is larger than 30/70 and smaller than 40/60.

(6) The circularly polarizing plate according to any one of (1) to (5), wherein one of the λ/2 plate and the λ/4 plate includes a layer formed of a resin containing a cyclic olefin polymer.

(7) The circularly polarizing plate according to any one of (1) to (6), wherein the circularly polarizing plate is a long-length film, and an absorption axis of the polarizing film is in a lengthwise direction of the circularly polarizing plate.

(8) A broadband λ/4 plate comprising:

a λ/2 plate having a slow axis in a direction forming an angle of 75°±5° with respect to a reference direction; and a λ/4 plate having a slow axis in a direction forming an angle of 15°±5° with respect to the reference direction, wherein a wavelength dispersion of the λ/2 plate and a wavelength dispersion of the λ/4 plate approximately coincide with each other, and when a refractive index in an in-plane slow axis direction is represented by nx, a refractive index in an in-place fast axis direction is represented by ny, and a refractive index in a thickness direction is represented by nz, a refractive index of one of the λ/2 plate and the λ/4 plate is nz≥nx>ny, and a refractive index of the other of the λ/2 plate and the λ/4 plate is nx>ny≥nz.

(9) The broadband λ/4 plate according to (8), wherein the broadband λ/4 plate is a long-length film, and the λ/2 plate and the λ/4 plate are produced by a production method including diagonal stretching.

10. An organic electroluminescent display device comprising the circularly polarizing plate according to any one of (1) to (6) or the broadband λ/4 plate according to (8) or (9).

Advantageous Effects of Invention

According to the present invention, there can be provided a circularly polarizing plate that can effectively reduce reflection of outside light in both a front direction and a tilt direction; a broadband λ/4 plate capable of achieving the circularly polarizing plate that can effectively reduce reflection of outside light in both a front direction and a tilt direction; and an organic electroluminescent display device including the circularly polarizing plate or the broadband λ/4 plate.

BRIEF DESCRIPTION OF DRAWINGS

FIG. 1 is an exploded perspective view of a circularly polarizing plate according to an embodiment of the present invention.

DESCRIPTION OF EMBODIMENTS

Hereinafter, the present invention will be described in detail with reference to embodiments and examples. However, the present invention is not limited to the following embodiments and examples, which can be optionally modified and implemented within the scope not departing from the claims of the present invention and their equivalents.

In the following description, the term "long-length" film refers to a film having a length of five times or more, and preferably ten times or more the film width, and specifically, a long-length film having a length such that it is wound up into a roll shape for storage or transportation.

In the following description, a refractive index nx of a film represents a refractive index in the in-plane slow axis direction of the film, unless otherwise stated. This refractive index nx usually is a refractive index in a direction (an in-plane direction) which is vertical to a film thickness direction and which provides a maximum refractive index.

In the following description, a refractive index ny of a film represents a refractive index in the in-plane fast axis direction of the film, unless otherwise stated. This refractive index ny usually represents a refractive index in a direction (an in-plane direction) which is vertical to a film thickness direction and orthogonal to the nx direction.

In the following description, a refractive index nz of a film represents a refractive index in the thickness direction of the film, unless otherwise stated.

The measurement wavelength for these refractive indices nx, ny, and nz is 590 nm, unless otherwise stated.

An in-plane phase difference Re of a film is a value represented by Re=(nx−ny)×d, unless otherwise stated. A thickness-direction phase difference Rth of a film is a value represented by Rth={(nx+ny)/2−nz}×d, unless otherwise stated. Furthermore, an NZ factor of a film is a value represented by (nx−nz)/(nx−ny), unless otherwise stated. Here, d represents a thickness of a film. The measurement wavelength is 590 nm, unless otherwise stated.

In the following description, a positive intrinsic birefringence value means that the refractive index in a stretching direction is larger than the refractive index in a direction orthogonal to the stretching direction, unless otherwise stated. A negative intrinsic birefringence value means that the refractive index in a stretching direction is smaller than the refractive index in a direction orthogonal to the stretching direction, unless otherwise stated. The value of the intrinsic birefringence may be calculated from a dielectric constant distribution.

In the following description, "(meth)acryl-" includes both "acryl-" and "methacryl-".

In the following description, a diagonal direction of a long-length film refers to a direction which is the in-plane direction of the film and neither parallel to nor vertical to the width direction of the film, unless otherwise stated.

In the following description, a front direction of a film means the normal line direction of the main surface of the film, unless otherwise stated. Specifically, it indicates a direction in which the polar angle with respect to the main surface is 0° and the azimuth angle in the main surface is 0°.

In the following description, a tilt direction of a film means a direction which is neither parallel to nor vertical to the main surface of the film, unless otherwise stated. Specifically, it indicates a direction in which the polar angle of the main surface falls within the range of larger than 0° and smaller than 90°.

In the following description, "parallel", "vertical" and "orthogonal", which are directions of an element, may contain an error within the range in which the effects of the present invention are not impaired, for example, in the range of ±5°, unless otherwise stated.

In the following description, a lengthwise direction of a long-length film is usually parallel to a direction of flow of a film in a production line.

In the following description, a "polarizing plate", a "λ/2 plate", and a "λ/4 plate" each include not only a rigid member, but also a flexible member such as a resin film, unless otherwise stated.

In the following description, angles formed by optical axes (an absorption axis, a slow axis, and the like) of each of a plurality of films included in a member indicate angles when the films are observed from a thickness direction, unless otherwise stated.

In the following description, a slow axis and a fast axis of a film represent an in-plane slow axis and an in-plane fast axis of the film, respectively, unless otherwise stated.

[1. Layer Configuration of Circularly Polarizing Plate]

FIG. 1 is an exploded perspective view of a circularly polarizing plate according to an embodiment of the present invention. In FIG. 1, an axis 112 as a projected line of an absorption axis 111 of a polarizing film 110 is indicated with a dot-and-dash line on the surface of a λ/2 plate 120. In FIG. 1, an axis 113 as a projected line of the absorption axis 111 of the polarizing film 110 is indicated with a dot-and-dash line on the surface of a λ/4 plate 130.

As illustrated in FIG. 1, a circularly polarizing plate 100 according to an embodiment of the present invention includes the polarizing film 110, the λ/2 plate 120, and the λ/4 plate 130 in this order in the thickness direction of the circularly polarizing plate 100.

The polarizing film 110 is a polarizing plate having the absorption axis 111. The polarizing film 110 has the function of absorbing linearly polarized light having a vibration direction parallel to the absorption axis 111, and permitting transmission of polarized light other than this linearly polarized light. Here, the vibration direction of linearly polarized light means the vibration direction of the electric field of the linearly polarized light.

The λ/2 plate 120 is an optical member having a specific phase difference. This λ/2 plate 120 has a slow axis 121 parallel to the in-plane direction of the λ/2 plate 120, in the direction forming a specific angle θh with respect to the absorption axis 111 of the polarizing film 110.

The λ/4 plate 130 is an optical member having a specific phase difference which is different from that of the λ/2 plate 120. This λ/4 plate 130 has a slow axis 131 parallel to the in-plane direction of the λ/4 plate 130, in the direction forming a specific angle θq with respect to the absorption axis 111 of the polarizing film 110.

In the circularly polarizing plate 100 having such a structure, a layer portion including the λ/2 plate 120 and the λ/4 plate 130 becomes a broadband λ/4 plate 140. The broadband λ/4 plate 140 capable of providing light which passes through the layer portion with an in-plane phase difference of approximately a quarter wavelength of the light in a wide wavelength range. Therefore, the circularly polarizing plate 100 can function as a circularly polarizing plate which can absorb one of clockwise circularly polarized light and counterclockwise circularly polarized light and transmits remaining light in a wide wavelength range.

The circularly polarizing plate 100 may be a sheet piece film, but is preferably a long-length film in terms of efficient production. When the circularly polarizing plate 100 is a long-length film, the absorption axis 111 of the polarizing film 110 is usually parallel to the lengthwise direction of the circularly polarizing plate 100.

[2. Polarizing Film]

The polarizing film usually includes a polarizer layer, and as necessary, a protective film layer for protecting the polarizer layer.

The polarizer layer may be obtained by, for example, performing an appropriate treatment such as a dyeing treatment with a dichroic material such as iodine and a dichroic dye, a stretching treatment, and a crosslinking treatment, in an appropriate order with an appropriate style, to a film of an appropriate vinyl alcohol-based polymer such as polyvinyl alcohol and partially formalized polyvinyl alcohol. Usually in the stretching treatment for producing the polarizer layer, a long-length film before stretching is stretched in a lengthwise direction. Therefore, an absorption axis parallel to the lengthwise direction of the polarizer layer can be expressed in the obtained polarizer layer. This polarizer layer is capable of absorbing linearly polarized light having a vibration direction parallel to the absorption axis. In particular, the polarizer layer having an excellent polarization degree is preferable. The thickness of the polarizer layer is, but not limited to, generally 5 μm to 80 μm.

As the protective film layer for protecting the polarizer layer, any transparent film may be used. In particular, a film of a resin which is excellent in transparency, mechanical strength, heat stability, moisture-blocking properties, and the like is preferable. Examples of such a resin may include acetate resin such as triacetyl cellulose, polyester resin, polyether sulfone resin, polycarbonate resin, polyamide resin, polyimide resin, polyolefin resin, cyclic olefin resin, and (meth)acrylic resin. Of these, acetate resin, cyclic olefin resin, and (meth)acrylic resin are preferable in terms of small birefringence, and cyclic olefin resin is particularly preferable from the viewpoint of transparency, low hygroscopicity, size stability, lightweight properties, and the like.

The polarizing film may be either a sheet piece polarizing film or a long-length polarizing film in conformity with the shape of the circularly polarizing plate.

When the long-length polarizing film is used, the absorption axis of the polarizing film is preferably parallel to the lengthwise direction of the polarizing film. This enables the polarizing film to have its absorption axis in the lengthwise direction of the long-length circularly polarizing plate including the polarizing film. Accordingly, a long-length circularly polarizing plate can usually be produced by bonding the long-length polarizing film, a long-length λ/2 plate, and a long-length λ/4 plate such that their lengthwise directions are parallel to one another. Therefore, a circularly polarizing plate can be produced by a roll-to-roll method. As a result, the production efficiency of the circularly polarizing plate can be enhanced.

The polarizing film can be produced by, for example, bonding the polarizer layer and the protective film layer. An adhesive may be used as necessary for the bonding. In particular when the polarizing film is produced as a long-length film, the polarizing film can be produced by bonding a long-length polarizer layer and a long-length protective film layer by a roll-to-roll method with their lengthwise directions being parallel to each other. As a result, production efficiency can be enhanced. Furthermore, when the sheet piece polarizing film is produced, a sheet piece polarizing film can be produced by cutting the long-length polarizing film into a specific shape.

[3. λ/2 Plate]

The λ/2 plate is an optical member having an in-plane phase difference of usually 240 nm or more and usually 300 nm or less at a measurement wavelength of 590 nm. Since the λ/2 plate has such an in-plane phase difference, the broadband λ/4 plate can be achieved by combining the λ/2 plate and the λ/4 plate. Therefore, the circularly polarizing plate according to the present invention can express the function of absorbing one of clockwise circularly polarized light and counterclockwise circularly polarized light in a wide wavelength range and permitting transmission of the remaining light through the circularly polarizing plate. In this manner, the circularly polarizing plate of the present invention enables to reduce reflection of light in a wide wavelength range in both a front direction and a tilt direction. In particular, for effectively reducing the reflection of outside light particularly in a tilt direction, the in-plane phase difference in the λ/2 plate at a measurement wavelength of 590 nm is preferably 250 nm or more, and is preferably 280 nm or less, and more preferably 265 nm or less.

The λ/2 plate has a wavelength dispersion which approximately coincides with the wavelength dispersion of the λ/4 plate. Here, the wavelength dispersion of a phase difference film is represented by a value obtained by dividing the in-plane phase difference at a wavelength of 400 nm by the in-plane phase difference at a wavelength of 550 nm. Therefore, the wavelength dispersion of the λ/2 plate is represented by "Reh(400)/Reh(550)", and the wavelength dispersion of the λ/4 plate is represented by "Req(400)/Req(550)". Here, Reh(400) is the in-plane phase difference of the λ/2 plate at a wavelength of 400 nm, Reh(550) is the in-plane phase difference of the λ/2 plate at a wavelength of 550 nm, Req(400) is the in-plane phase difference of the λ/4 plate at a wavelength of 400 nm, and Req(550) is the in-plane phase difference of the λ/4 plate at a wavelength of 550 nm. Specifically, that the wavelength dispersion of the λ/2 plate and the wavelength dispersion of the λ/4 plate approximately coincide with each other means that the following formula (A) is satisfied:

$$|Reh(400)/Reh(550) - Req(400)/Req(550)| < 1.00.$$

The above-mentioned |Reh(400)/Reh(550)−Req(400)/Req(550)| is preferably 0.60 or less, more preferably 0.10 or less, and particularly preferably 0.06 or less. By combining in this manner the λ/2 plate and the λ/4 plate which have wavelength dispersions approximately coinciding with each other, reflection of outside light in the front direction of the circularly polarizing plate according to the present invention can be effectively reduced.

In the circularly polarizing plate according to the present invention, the refractive index of one of the λ/2 plate and the λ/4 plate is $nz \geq nx > ny$, and the refractive index of the other of the λ/2 plate and the λ/4 plate is $nx > ny \geq nz$. Therefore, when the refractive indices nx, ny, and nz of the λ/4 plate satisfy $nz \geq nx > ny$, the refractive indices nx, ny, and nz of the λ/2 plate satisfy $nx > ny \geq nz$. When the refractive indices nx, ny, and nz of the λ/4 plate satisfy $nx > ny \geq nz$, the refractive indices nx, ny, and nz of the λ/2 plate satisfy $nz \geq nx > ny$. Accordingly, apparent angle errors of the slow axis of the λ/2 plate and the slow axis of the λ/4 plate when the circularly polarizing plate is observed from a tilt direction can be compensated. Therefore, the circularly polarizing plate according to the present invention can effectively reduce reflection of outside light in a tilt direction.

Furthermore, in the circularly polarizing plate according to the present invention, the NZ factor of one of the λ/2 plate and the λ/4 plate is preferably −0.5 to 0.0, while the NZ factor of the other of the λ/2 plate and the λ/4 plate is preferably 1.0 to 1.3. Specifically, when the refractive indices nx, ny, and nz of the λ/2 plate satisfy $nx > ny \geq nz$, the NZ factor (NZh) of the λ/2 plate is preferably 1.3 or less, more preferably 1.2 or less, and particularly preferably 1.1 or less. When the refractive indices nx, ny, and nz of the λ/2 plate satisfy $nz \geq nx > ny$, the NZ factor (NZh) of the λ/2 plate is preferably −0.5 or more, more preferably −0.3 or more, and particularly preferably −0.2 or more. Accordingly, apparent angle errors of the slow axis of the λ/2 plate and the slow axis of the λ/4 plate when the circularly polarizing plate is observed from a tilt direction can be appropriately compensated. Therefore, the circularly polarizing plate according to the present invention can effectively reduce reflection of outside light in a tilt direction.

The λ/2 plate has its slow axis in the direction forming a specific angle θh with respect to the absorption axis of the polarizing film. Regarding this feature, the range of the above-mentioned angle θh is usually 15°±5°. When the angle θh formed by the slow axis of the λ/2 plate with respect to the absorption axis of the polarizing film is confined within the above-mentioned range, the broadband λ/4 plate can be provided by combining the λ/2 plate and the λ/4 plate. Therefore, the circularly polarizing plate of the present invention can reduce reflection of light in a wide wavelength range in both a front direction and a tilt direction. The angle θh formed by the slow axis of the λ/2 plate with respect to the absorption axis of the polarizing film is preferably 15°±3°, and more preferably 15°±1°. Accordingly, reflection of outside light can be effectively reduced, particularly in a tilt direction, by the circularly polarizing plate of the present invention.

The total light transmittance of the λ/2 plate is preferably 80% or more. The light transmittance may be measured using a spectrophotometer (ultraviolet-visible-near-infrared spectrophotometer "V-570" manufactured by Jasco Corporation) in accordance with JIS K0115.

The haze of the λ/2 plate is preferably 5% or less, more preferably 3% or less, particularly preferably 1% or less, and ideally 0%. Here, the haze is an average value calculated from measurement at five points using a "turbidimeter NDH-300A" manufactured by NIPPON DENSHOKU INDUSTRIES CO., LTD. in accordance with JIS K7361-1997.

The thickness of the λ/2 plate is preferably 10 μm or more, more preferably 15 μm or more, and further preferably 30 μm or more, and is preferably 100 μm or less, more preferably 80 μm or less, and further preferably 60 μm or less. Accordingly, the mechanical strength of the λ/2 plate can be enhanced.

[4. λ/4 Plate]

The λ/4 plate is an optical member having an in-plane phase difference of usually 110 nm or more and usually 154 nm or less at a measurement wavelength of 590 nm. Since the λ/4 plate has such an in-plane phase difference, the broadband λ/4 plate can be achieved by combining the λ/2 plate and the λ/4 plate. Therefore, the circularly polarizing plate according to the present invention can express the function of absorbing one of clockwise circularly polarized light and counterclockwise circularly polarized light in a wide wavelength range and permitting transmission of the remaining light through the circularly polarizing plate. Therefore, the circularly polarizing plate of the present invention can reduce reflection of light in a wide wavelength range in both a front direction and a tilt direction. In particular, for effectively reducing reflection of outside light particularly in a tilt direction, the in-plane phase difference of the λ/4 plate at a measurement wavelength of 590 nm is preferably 118 nm or more, and is preferably 138 nm or less, and more preferably 128 nm or less.

In the circularly polarizing plate according to the present invention, the refractive index of one of the λ/2 plate and the λ/4 plate is nz≥nx>ny, and the refractive index of the other of the λ/2 plate and the λ/4 plate is nx>ny≥nz, as mentioned above. Therefore, when the refractive indices nx, ny, and nz of the λ/2 plate satisfy nz≥nx>ny, the refractive indices nx, ny, and nz of the λ/4 plate satisfy nx>ny≥nz. When the refractive indices nx, ny, and nz of the λ/2 plate satisfy nx>ny nz, the refractive indices nx, ny, and nz of the λ/4 plate satisfy nz≥nx>ny. Therefore, apparent angle errors of the slow axis of the λ/2 plate and the slow axis of the λ/4 plate when the circularly polarizing plate is observed from a tilt direction can be compensated. Therefore, the circularly polarizing plate according to the present invention can effectively reduce reflection of outside light in a tilt direction.

Furthermore, in the circularly polarizing plate according to the present invention, the NZ factor of one of the λ/2 plate and the λ/4 plate is preferably −0.5 to 0.0, while the NZ factor of the other of the λ/2 plate and the λ/4 plate is preferably 1.0 to 1.3, as mentioned above. Specifically, when the refractive indices nx, ny, and nz of the λ/4 plate satisfy nx>ny≥nz, the NZ factor (NZh) of the λ/4 plate is preferably 1.3 or less, more preferably 1.2 or less, and particularly preferably 1.1 or less. When the refractive indices nx, ny, and nz of the λ/4 plate satisfy nz≥nx>ny, the NZ factor (NZh) of the λ/4 plate is preferably −0.5 or more, more preferably −0.3 or more, and particularly preferably-0.2 or more, and is preferably 0.0 or less. Accordingly, apparent angle errors of the slow axis of the λ/2 plate and the slow axis of the λ/4 plate when the circularly polarizing plate is observed from a tilt direction can be appropriately compensated. Therefore, the circularly polarizing plate according to the present invention can effectively reduce reflection of outside light in a tilt direction.

The λ/4 plate has its slow axis in the direction forming a specific angle θq with respect to the absorption axis of the polarizing film. Regarding this feature, the range of the above-mentioned angle θq is usually 75°±5°. When the angle θq formed by the slow axis of the λ/4 plate with respect to the absorption axis of the polarizing film is confined within the above-mentioned range, the broadband λ/4 plate can be achieved by combining the λ/2 plate and the λ/4 plate. Therefore, the circularly polarizing plate of the present invention can reduce reflection of light in a wide wavelength range in both a front direction and a tilt direction. The angle θq formed by the slow axis of the λ/4 plate with respect to the absorption axis of the polarizing film is preferably 75°±3°, and more preferably 75°±1°. Accordingly, reflection of outside light can be effectively reduced, particularly in a tilt direction, by the circularly polarizing plate of the present invention.

Here, the orientation in which the slow axis of the λ/4 plate forms the angle θq with respect to the absorption axis of the polarizing film is identical to the orientation in which the slow axis of the λ/2 plate forms the angle θh with respect to the absorption axis of the polarizing film. Therefore, for example, when the circularly polarizing plate is observed from a thickness direction, in the case in which the slow axis of the λ/2 plate forms an angle of the angle θh with respect to the absorption axis of the polarizing film in a clockwise orientation, the slow axis of the λ/4 plate forms an angle of the angle θq with respect to the absorption axis of the polarizing film in a clockwise orientation. Furthermore, for example, when the circularly polarizing plate is observed from the thickness direction, in the case in which the slow axis of the λ/2 plate forms an angle of the angle θh with respect to the absorption axis of the polarizing film in a counterclockwise orientation, the slow axis of the λ/4 plate forms an angle of the angle θq with respect to the absorption axis of the polarizing film in a counterclockwise orientation.

The total light transmittance of the λ/4 plate is preferably 80% or more.

The haze of the λ/4 plate is preferably 5% or less, more preferably 3% or less, particularly preferably 1% or less, and ideally 0%.

The thickness of the λ/4 plate is preferably 40 μm or more, more preferably 45 μm or more, and particularly preferably 50 μm or more, and is preferably 80 μm or less, more preferably 75 μm or less, and particularly preferably 70 μm or less. When the thickness of the λ/4 plate is equal to or more than the lower limit value of the above-mentioned range, a desired phase difference can be easily expressed. When it is equal to or less than the upper limit value, the thickness of the circularly polarizing plate can be reduced.

[5. Phase Difference Film to be Used as λ/2 Plate and λ/4 Plate]

As the λ/2 plate and the λ/4 plate which have the above-described optical properties, a phase difference film including a resin layer is usually used. A stretched film obtained by stretching a pre-stretch film formed of a resin is particularly preferable as a phase difference film used for the λ/2 plate and the λ/4 plate, since the area can be easily increased to allow efficient production. The λ/2 plate and the λ/4 plate may be single-layer films each including only one layer, or may be multi-layer films each including two or more layers.

As the resin for forming the λ/2 plate and the λ/4 plate, thermoplastic resins are preferable. These resins may be resins each having a positive intrinsic birefringence value, or may be a resin having a negative intrinsic birefringence value.

The resin having a positive intrinsic birefringence value usually contains a polymer having a positive intrinsic birefringence value. Examples of this polymer may include polyolefins such as polyethylene and polypropylene; polyesters such as polyethylene terephthalate and polybutylene terephthalate; polyarylene sulfides such as polyphenylene sulfide; polyvinyl alcohol; polycarbonate; polyalylate; a cellulose ester polymer and polyether sulfone; polysulfone; polyallyl sulfone; polyvinyl chloride; a cyclic olefin polymer such as a norbornene polymer; and a rod-like liquid crystal polymer.

The resin having a negative intrinsic birefringence value usually contains a polymer having a negative intrinsic birefringence value. Examples of this polymer may include a polystyrene-based polymer including a homopolymer of a styrene compound and a copolymer of a styrene compound and an optional monomer; a polyacrylonitrile polymer; a polymethyl methacrylate polymer; and multicomponent copolymers thereof. Examples of the optional monomer to be copolymerized with a styrene compound may include acrylonitrile, maleic anhydride, methyl methacrylate, and butadiene.

The above-mentioned polymer may be either a homopolymer or a copolymer.

As the above-mentioned polymer, one type thereof may be used alone, and two or more types thereof may also be used in combination at any ratio. For example, the polymer having a positive intrinsic birefringence value and the polymer having a negative intrinsic birefringence value may be used in combination.

In particular, it is preferable to use a phase difference film including a layer containing the resin having a positive intrinsic birefringence value as one of the λ/2 plate and the λ/4 plate, and to use a phase difference film including a layer containing the resin having a negative intrinsic birefringence value as the other of the λ/2 plate and the λ/4 plate. It is particularly preferable to use a phase difference film including a layer formed of a resin containing polyphenylene ether and a polystyrene-based polymer having a syndiotactic structure, as one of the λ/2 plate and the λ/4 plate, and a phase difference film including a layer formed of a resin containing a cyclic olefin polymer, as the other of the λ/2 plate and the λ/4 plate. Hereinafter, the "resin containing polyphenylene ether and a polystyrene-based polymer having a syndiotactic structure" is sometimes appropriately referred to as a "blend resin p1". The "resin containing a cyclic olefin polymer" is sometimes appropriately referred to as a "cyclic olefin resin". The cyclic olefin resin has a small wavelength dispersion. The wavelength dispersion of the blend resin p1 is capable of being adjusted in accordance with the mixing ratio of the polyphenylene ether and the syndiotactic polystyrene. Accordingly, the wavelength dispersions of the λ/2 plate and the λ/4 plate are easily set to approximately coincide with each other by using the phase difference film including a layer formed of the blend resin p1 as one of the λ/2 plate and the λ/4 plate and the phase difference film including a layer formed of the cyclic olefin resin as the other of the λ/2 plate and the λ/4 plate. Therefore, the optical characteristics of the circularly polarizing plate according to the present invention can be further improved.

[5.1. Phase Difference Film Including Layer Formed of Blend Resin p1]

The sign (positive or negative) of the intrinsic birefringence value of the blend resin p1 can be adjusted by the type and amount of the polymer contained in the blend resin p1. The blend resin p1 having a negative intrinsic birefringence value is usually used. The phase difference film including a layer formed of the blend resin p1 may be used as the λ/2 plate, but is preferably used as the λ/4 plate. The refractive index of the phase difference film including a layer formed of the blend resin p1 may satisfy nz≥nx>ny, or may satisfy nx>ny≥nz. The wavelength dispersion of the blend resin p1 can be adjusted with a high degree of flexibility by adjusting the amount ratio between the polyphenylene ether and the polystyrene-based polymer.

Polyphenylene ether is usually a polymer having a positive intrinsic birefringence value. This polyphenylene ether contains a structural unit having a structure formed by polymerizing phenyl ether or a phenyl ether derivative. Usually, a polymer having as a main chain a structural unit having a phenylene ether skeleton is used as the polyphenylene ether. Hereinafter, the "structural unit having a phenylene ether skeleton" is appropriately referred to as a "phenylene ether unit". However, a benzene ring in the phenylene ether unit may have a substituent, as long as the effects of the present invention are not significantly impaired.

A polymer containing a phenylene ether unit represented by the following formula (I) is particularly preferable as the polyphenylene ether.

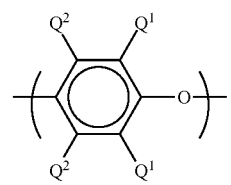

(I)

In the formula (I), each $Q^1$ independently represents a halogen atom, a lower alkyl group (for example, an alkyl group having seven or fewer carbon atoms), a phenyl group, a haloalkyl group, an aminoalkyl group, a hydrocarbon oxy group, or a halohydrocarbon oxy group (with a proviso that the halogen atom and the oxygen atom are separated by at least two carbon atoms). Of these, as $Q^1$, an alkyl group and a phenyl group are preferable, and an alkyl group having one or more and four or fewer carbon atoms is more preferable.

In the formula (I), each $Q^2$ independently represents a hydrogen atom, a halogen atom, a lower alkyl group (for example, an alkyl group having seven or fewer carbon atoms), a phenyl group, a haloalkyl group, a hydrocarbon oxy group, or a halohydrocarbon oxy group (with a proviso that the halogen atom and the oxygen atom are separated by at least two carbon atoms). Of these, a hydrogen atom is preferable as $Q^2$.

The polyphenylene ether may be a homopolymer having one type of structural unit, and may be a copolymer having two or more types of structural units.

When the polymer containing the structural unit represented by the formula (I) is a homopolymer, preferable examples of the homopolymer may include a homopolymer having a 2,6-dimethyl-1,4-phenylene ether unit (a structural unit represented by "—(C$_6$H$_2$(CH$_3$)$_2$—O)—").

When the polymer containing the structural unit represented by the formula (I) is a copolymer, preferable examples of the copolymer may include a random copolymer having a combination of a 2,6-dimethyl-1,4-phenylene ether unit and a 2,3,6-trimethyl-1,4-phenylene ether unit (a structural unit represented by "—(C$_6$H(CH$_3$)$_3$—O—)—").

The polyphenylene ether may contain an optional structural unit other than the phenylene ether unit. In this case, the polyphenylene ether is a copolymer having the phenylene ether unit and an optional structural unit. However, the amount of the optional structural unit in the polyphenylene ether is preferably small to the extent in which the effects of the present invention are not significantly impaired. Specifically, the amount of the phenylene ether unit in the polyphenylene ether is preferably 50% by weight or more, more preferably 70% by weight or more, and particularly preferably 80% by weight or more.

As the polyphenylene ether, one type thereof may be used alone, and two or more types thereof may also be used in combination at any ratio.

The weight average molecular weight of the polyphenylene ether is preferably 15,000 or more, more preferably 25,000 or more, and particularly preferably 35,000 or more, and is preferably 100,000 or less, more preferably 85,000 or less, and particularly preferably 70,000 or less. When the weight average molecular weight is equal to or more than the lower limit value of the above-mentioned range, the strength of the layer formed of the blend resin p1 can be enhanced. When it is equal to or less than the upper limit value, the dispersibility of polyphenylene ether can be enhanced, so that the polyphenylene ether and the polystyrene-based polymer can be mixed with high uniformity.

As the weight average molecular weight, a standard polystyrene equivalent value may be employed, wherein the value may be measured by a gel permeation chromatography (GPC) using 1,2,4-trichlorobenzene as a solvent at a temperature of 135° C.

The method for producing the polyphenylene ether is not particularly limited, and the polyphenylene ether may be produced by, for example, the method described in Japanese Patent Application Laid-Open No. Hei. 11-302529 A.

The polystyrene-based polymer having a syndiotactic structure is usually a polymer having a negative intrinsic birefringence value. This polystyrene-based polymer contains a structural unit formed by polymerizing a styrene compound. Hereinafter, the "structural unit formed by polymerizing a styrene compound" is appropriately referred to as a "styrene compound unit". Examples of the styrene compound may include styrene and a styrene derivative. An example of the styrene derivative may include a product obtained by substituting a substituent on a benzene ring or an α-position of styrene.

Specific examples of the styrene compound may include styrene; alkylstyrene such as methylstyrene and 2,4-dimethylstyrene; halogenated styrene such as chlorostyrene; halogen-substituted alkylstyrene such as chloromethylstyrene; and alkoxystyrene such as methoxystyrene. Of these, styrene which does not have a substituent is preferable as the styrene compound. As the styrene compound, one type thereof may be used alone, and two or more types thereof may also be used in combination at any ratio.

As the polystyrene-based polymer in the blend resin p1, a polystyrene-based polymer having a syndiotactic structure is used. That the polystyrene-based polymer has a syndiotactic structure means that the stereochemical structure of the polystyrene-based polymer is a syndiotactic structure. The syndiotactic structure is a stereostructure in which, in the Fischer projection formula, phenyl groups as side chains are alternately located on the opposite sides with respect to the main chain formed from carbon-carbon bonds.

The tacticity (stereoregularity) of the polystyrene-based polymer may be quantified by a nuclear magnetic resonance method using a carbon isotope ($^{13}$C-NMR). The tacticity measured by the $^{13}$C-NMR may be represented by the existence ratio of structural units which are successively present in plurality. In general, for example, the tacticity becomes a diad when the number of successively present structural units is two, a triad when it is three, and a pentad when it is five. In this case, the above-mentioned polystyrene-based polymer having a syndiotactic structure indicates a racemic diad having a syndiotacticity of preferably 75% or more, and more preferably 85% or more, or a racemic pentad having a syndiotacticity of preferably 30% or more, and more preferably 50% or more.

Examples of the polystyrene-based polymer may include polystyrene, poly(alkylstyrene), poly(halogenated styrene), poly(halogenated alkylstyrene), poly(alkoxystyrene), poly(vinylbenzoic acid ester), and hydrogenated polymers thereof and copolymers thereof.

Examples of the poly(alkylstyrene) may include poly(methylstyrene), poly(ethylstyrene), poly(isopropylstyrene), poly(t-butylstyrene), poly(phenylstyrene), poly(vinylnaphthalene), and poly(vinylstyrene).

Examples of the poly(halogenated styrene) may include poly(chlorostyrene), poly(bromostyrene), and poly(fluorostyrene).

Examples of the poly(halogenated alkylstyrene) may include poly(chloromethylstyrene).

Examples of the poly(alkoxystyrene) may include poly(methoxystyrene) and poly(ethoxystyrene).

Of these, particularly preferable examples of the polystyrene-based polymer may include polystyrene, poly(p-methylstyrene), poly(m-methylstyrene), poly(p-t-butylstyrene), poly(p-chlorostyrene), poly(m-chlorostyrene), poly(p-fluorostyrene), hydrogenated polystyrene, and copolymers containing these structural units.

The polystyrene-based polymer may be a homopolymer having only one type of structural unit, and may be a copolymer having two or more types of structural units. When the polystyrene-based polymer is a copolymer, it may be a copolymer containing two or more types of styrene compound units, or may be a copolymer containing a styrene compound unit and a structural unit other than the styrene compound unit. However, when the polystyrene-based polymer is the copolymer containing a styrene compound unit and a structural unit other than the styrene compound unit, the amount of the structural unit other than the styrene compound unit in the polystyrene-based polymer is preferably small to the extent in which the effects of the present invention are not significantly impaired. Specifically, the amount of the styrene compound unit in the polystyrene-based polymer is preferably 80% by weight or more, more preferably 83% by weight or more, and particularly preferably 85% by weight or more. Usually, when the amount of the styrene compound unit falls within such a range, a desired phase difference can be easily expressed in the layer formed of the blend resin p1.

As the polystyrene-based polymer, one type thereof may be used alone, and two or more types thereof may also be used in combination at any ratio.

The weight average molecular weight of the polystyrene-based polymer is usually 130,000 or more, preferably 140,000 or more, and more preferably 150,000 or more, and is usually 300,000 or less, preferably 270,000 or less, and more preferably 250,000 or less. When the weight average molecular weight falls within such a range, the glass transition temperature of the polystyrene-based polymer can be increased, thereby stably improving heat resistance of the layer formed of the blend resin p1.

The glass transition temperature of the polystyrene-based polymer is preferably 85° C. or higher, more preferably 90° C. or higher, and particularly preferably 95° C. or higher. When the glass transition temperature of the polystyrene-based polymer is increased in this manner, the glass transition temperature of the blend resin p1 can be effectively increased, thereby stably improving heat resistance of the layer formed of the blend resin p1. From the viewpoint of stable and easy production of the phase difference film which can be used as the λ/2 plate or the λ/4 plate, the glass transition temperature of the polystyrene-based polymer is preferably 160° C. or lower, more preferably 155° C. or lower, and particularly preferably 150° C. or lower.

The polystyrene-based polymer having the syndiotactic structure may be produced by, for example, polymerizing a styrene compound using as catalysts a titanium compound and a condensation product of water and trialkylaluminum (see Japanese Patent Application Laid-Open No. Sho. 62-187708 A) in an inert hydrocarbon solvent or in the absence of a solvent. The poly(halogenated alkylstyrene) may be produced by, for example, the method described in Japanese Patent Application Laid-Open No. Hei. 01-146912 A. Furthermore, hydrogenated polymers thereof may be produced by, for example, the method described in Japanese Patent Application Laid-Open No. Hei. 01-178505 A.

The polyphenylene ether and the polystyrene-based polymer contained in the blend resin p1: (i) have wavelength dispersions different from each other; (ii) have different signs of intrinsic birefringence values; and (iii) are compatible with each other. Therefore, the wavelength dispersion of the layer formed of the blend resin p1 can be adjusted by adjusting the weight ratio between the amount of the polyphenylene ether and the amount of the polystyrene-based polymer. In order to enhance the ability of the circularly polarizing plate to reduce reflection of outside light in both a front direction and a tilt direction, the weight ratio between the polyphenylene ether and the polystyrene-based polymer ("amount of polyphenylene ether"/"amount of polystyrene-based polymer") is preferably confined within a specific range. The specific range of this weight ratio is preferably larger than 30/70, more preferably 32/68 or larger, and particularly preferably 34/66 or larger, and is preferably smaller than 40/60, more preferably 38/62 or smaller, and particularly preferably 37/63 or smaller. When the circularly polarizing plate according to the present invention includes, as the $\lambda/2$ plate and the $\lambda/4$ plate, a combination of the phase difference film including the layer formed of the blend resin p1 and the phase difference film including the layer formed of the resin including the cyclic olefin polymer, reflection of outside light can be particularly effectively reduced by causing the weight ratio ("amount of polyphenylene ether"/ "amount of polystyrene-based polymer") to fall within the above-mentioned range.

The mechanism for enabling adjustment of the wavelength dispersion of the layer formed of the blend resin p1 is inferred as follows. However, the present invention is not limited to the following inference.

The polyphenylene ether and the polystyrene-based polymer are compatible with each other. Therefore, when the layer formed of the blend resin p1 is stretched, the phase difference expressed by the orientation of the polyphenylene ether and the phase difference expressed by the orientation of the polystyrene-based polymer are combined to generate the phase difference of the layer formed of the blend resin p1 as a whole. Here, the polyphenylene ether and the polystyrene-based polymer have different signs of intrinsic birefringence values. Therefore, the value of the phase difference of the entire layer formed of the blend resin p1 appears as a difference between the phase difference expressed by the orientation of the polyphenylene ether and the phase difference expressed by the orientation of the polystyrene-based polymer. Regarding the wavelength dispersion of the phase difference expressed when the layer formed of the blend resin p1 is stretched, there is a difference between the wavelength dispersion of the polyphenylene ether and the wavelength dispersion of the polystyrene-based polymer. Specifically, the wavelength dispersion of the polyphenylene ether is usually larger than the wavelength dispersion of the polystyrene-based polymer. Therefore, a balance between the magnitude of the phase difference expressed by the orientation of the polyphenylene ether and the magnitude of the phase difference expressed by the orientation of the polystyrene-based polymer can be adjusted by appropriately adjusting the ratio between the amount of the polyphenylene ether and the amount of the polystyrene-based polymer. Accordingly, the value of the phase difference which is expressed as the whole layer formed of the blend resin p1 can be adjusted for each wavelength. Therefore, it is inferred that the wavelength dispersion of the layer formed of the blend resin p1 can be adjusted by adjusting the weight ratio between the polyphenylene ether and the polystyrene-based polymer in the layer formed of the blend resin p1 (see Japanese Patent Application Laid-Open No. 2012-226996 A).

The ratio of the sum of the polyphenylene ether and the polystyrene-based polymer in the blend resin p1 is preferably 50% by weight to 100% by weight, more preferably 70% by weight to 100% by weight, and particularly preferably 90% by weight to 100% by weight. When the ratio of the sum of the polyphenylene ether and the polystyrene-based polymer falls within the above-mentioned range, the layer formed of the blend resin p1 can express appropriate optical characteristics.

The blend resin p1 may contain an optional component other than the polyphenylene ether and the polystyrene-based polymer.

For example, the blend resin p1 may contain a polymer other than the above-described polyphenylene ether and polystyrene-based polymer. When the sum of the polyphenylene ether and the polystyrene-based polymer is assumed to be 100 parts by weight, the amount of the polymer other than the polyphenylene ether and the polystyrene-based polymer is preferably 15 parts by weight or less, more preferably 10 parts by weight or less, and particularly preferably 5 parts by weight or less.

For example, the blend resin p1 may contain an additive. Examples of the additive may include: lamellar crystal compounds; fine particles; stabilizers such as an antioxidant, a thermostabilizer, a light stabilizer, a weathering stabilizer, an ultraviolet absorber, and a near-infrared absorber; a plasticizer: coloring agents such as dyes and a pigment; and an antistatic agent. As the additive, one type thereof may be used alone, and two or more types thereof may also be used in combination at any ratio.

The amount of the additive may be appropriately set within the range in which the effects of the present invention are not significantly impaired. For example, the amount may be set within the range in which the total light transmittance of the layer formed of the blend resin p1 can be maintained at 85% or higher.

Among the above-described additives, an ultraviolet absorber is preferable, because it can improve weather resistance.

Examples of the ultraviolet absorber may include an oxybenzophenone-based compound, a benzotriazole-based compound, a salicylate-based compound, a benzophenone-based ultraviolet absorber, a benzotriazole-based ultraviolet absorber, an acrylonitrile-based ultraviolet absorber, a triazine-based compound, a nickel complex salt-based compound, and an inorganic powder. Examples of a suitable ultraviolet absorber may include 2,2'-methylenebis(4-(1,1, 3,3-tetramethylbutyl)-6-(2H-benzotriazole-2-yl)phenol), 2-(2'-hydroxy-3'-tert-butyl-5'-methylphenyl)-5-chlorobenzotriazole, 2,4-di-tert-butyl-6-(5-chlorobenzotriazole-2-yl) phenol, 2,2'-dihydroxy-4,4'-dimethoxybenzophenone, and 2,2',4,4'-tetrahydroxybenzophenone. Of these, 2,2'-methylenebis(4-(1,1,3,3-tetramethylbutyl)-6-(2H-benzotriazole-2-yl)phenol is particularly suitable.

The glass transition temperature of the blend resin p1 is preferably 115° C. or higher, more preferably 118° C. or higher, and still more preferably 120° C. or higher. Since the blend resin p1 contains a combination of the polyphenylene ether and the polystyrene-based polymer, the blend resin p1 can have a glass transition temperature higher than that of a resin containing only the polystyrene-based polymer. When the glass transition temperature is high, orientation relaxation of the blend resin p1 can be reduced. Therefore, the $\lambda/2$ plate or the $\lambda/4$ plate which is excellent in heat resistance can be achieved. The upper limit of the glass transition temperature of the blend resin p1 is not particularly limited, but usually it is 200° C. or lower.

The phase difference film including the layer formed of the blend resin p1 may include an optional layer in combination with the layer formed of the blend resin p1. As the optional layer to be combined with the layer formed of the blend resin p1, a layer formed of an optional resin may be used. For example, the phase difference film including the layer formed of the blend resin p1 may include a protective layer formed of (meth)acrylic resin having a (meth)acrylic polymer. The layer formed of the blend resin p1 tends to have low mechanical strength. However, since the protective layer formed of (meth)acrylic resin has excellent mechanical strength, the combination of the layer formed of the blend resin p1 and the protective layer can suppress the damage of the layer formed of the blend resin p1 during molding and stretching. Furthermore, the protective layer usually enables to suppress bleedout of the component of the layer formed of the blend resin p1.

The (meth)acrylic polymer is a polymer containing a structural unit having a structure formed by polymerizing (meth)acrylic acid or a (meth)acrylic acid derivative.

Examples of the (meth)acrylic polymer may include homopolymers and copolymers of acrylic acid, acrylic acid esters, acrylamide, acrylonitrile, methacrylic acid, and methacrylic acid esters.

Of these, a polymer containing a structural unit formed by polymerizing a (meth)acrylic acid ester is preferable as the (meth)acrylic polymer. Examples of the (meth)acrylic acid esters may include alkyl esters of (meth)acrylic acid. Among the alkyl esters of (meth)acrylic acid, a product derived from (meth)acrylic acid and alkanol or cycloalkanol is preferable, and a product derived from (meth)acrylic acid and alkanol is more preferable. Furthermore, the number of carbon atoms per molecule of the above-mentioned alkanol or cycloalkanol is preferably 1 to 15, and more preferably 1 to 8. When the number of carbon atoms per molecule of alkanol or cycloalkanol is small as described above, rupture elongation of a film can be increased.

Specific examples of the acrylic acid ester may include methyl acrylate, ethyl acrylate, n-propyl acrylate, i-propyl acrylate, n-butyl acrylate, i-butyl acrylate, sec-butyl acrylate, t-butyl acrylate, n-hexyl acrylate, cyclohexyl acrylate, n-octyl acrylate, 2-ethylhexyl acrylate, n-decyl acrylate, and n-dodecyl acrylate.

Specific examples of the methacrylic acid ester may include methyl methacrylate, ethyl methacrylate, n-propyl methacrylate, i-propyl methacrylate, n-butyl methacrylate, i-butyl methacrylate, sec-butyl methacrylate, t-butyl methacrylate, n-hexyl methacrylate, n-octyl methacrylate, 2-ethylhexyl methacrylate, n-decyl methacrylate, and n-dodecyl methacrylate.

Furthermore, the above-mentioned (meth)acrylic acid ester may have a substituent such as a hydroxyl group and a halogen atom within the range in which the effects of the present invention are not significantly impaired. Examples of such (meth)acrylic acid ester having such a substituent may include 2-hydroxyethyl acrylate, 2-hydroxypropyl acrylate, 4-hydroxybutyl acrylate, 2-hydroxyethyl methacrylate, 2-hydroxypropyl methacrylate, 4-hydroxybutyl methacrylate, 3-chloro-2-hydroxypropyl methacrylate, and glycidyl methacrylate.

The amount of the structural unit having a structure formed by polymerizing (meth)acrylic acid or a (meth)acrylic acid derivative in the (meth)acrylic polymer is preferably 50% by weight or more, more preferably 85% by weight or more, and particularly preferably 90% by weight or more.

The (meth)acrylic polymer may be a polymer of only (meth)acrylic acid or a (meth)acrylic acid derivative, or may be a copolymer of (meth)acrylic acid or a (meth)acrylic acid derivative and an optional monomer copolymerizable therewith. Examples of the optional monomer may include $\alpha,\beta$-ethylenic unsaturated carboxylic acid ester monomers other than (meth)acrylic acid ester, as well as $\alpha,\beta$-ethylenic unsaturated carboxylic acid monomers, alkenyl aromatic monomers, conjugated diene monomers, non-conjugated diene monomers, carboxylic acid-unsaturated alcohol esters, and olefin monomers.

Specific examples of the $\alpha,\beta$-ethylenic unsaturated carboxylic acid ester monomers other than (meth)acrylic acid ester may include dimethyl fumarate, diethyl fumarate, dimethyl maleate, diethyl maleate, and dimethyl itaconate.

The $\alpha,\beta$-ethylenic unsaturated carboxylic acid monomer may be any of monocarboxylic acids, polycarboxylic acid, partial esters of polycarboxylic acid, and anhydrides of polycarboxylic acids. Specific examples thereof may include crotonic acid, maleic acid, fumaric acid, itaconic acid, monoethyl maleate, mono-n-butyl fumarate, maleic anhydride, and itaconic anhydride.

Specific examples of the alkenyl aromatic monomers may include styrene, $\alpha$-methylstyrene, methyl $\alpha$-methylstyrene, vinyl toluene, and divinylbenzene.

Specific examples of the conjugated diene monomers may include 1,3-butadiene, 2-methyl-1,3-butadiene, 1,3-pentadiene, 2,3-dimethyl-1,3-butadiene, 2-chlor-1,3-butadiene, and cyclopentadiene.

Specific examples of the non-conjugated diene monomers may include 1,4-hexadiene, dicyclopentadiene, and ethylidene norbornene.

Specific examples of the carboxylic acid-unsaturated alcohol ester monomers may include vinyl acetate.

Specific examples of the olefin monomers may include ethylene, propylene, butene, and pentene.

As the optional monomer copolymerizable with the (meth)acrylic acid or the (meth)acrylic acid derivative, one type thereof may be used alone, and two or more types thereof may also be used in combination at any ratio.

As the (meth)acrylic polymer, one type thereof may be used alone, and two or more types thereof may also be used in combination at any ratio.

Of these (meth)acrylic polymers, polymethacrylates are preferable. Among the polymethacrylates, polymethyl methacrylate is more preferable.

The amount of the (meth)acrylic polymer in the (meth) acrylic resin is preferably 50% by weight to 100% by weight, more preferably 70% by weight to 100% by weight, and particularly preferably 90% by weight to 100% by weight. When the amount of the (meth)acrylic polymer falls within the above-mentioned range, the mechanical strength of the protective layer can be effectively enhanced.

The (meth)acrylic resin may contain rubber particles. When the (meth)acrylic resin contains the rubber particles, the flexibility of the (meth)acrylic resin is enhanced, and impact resistance can be improved. In addition, the rubber particles form irregularities on the surface of the protective layer, and the area of contact on the surface of the protective layer is reduced. Therefore, usually, slidability on the surface of the protective layer can be enhanced.

Examples of rubber forming the rubber particles may include acrylic acid ester polymer rubbers, polymer rubbers composed mainly of butadiene, and ethylene-vinyl acetate copolymer rubbers. Examples of the acrylic acid ester polymer rubber may include rubbers containing butyl acrylate, 2-ethylhexyl acrylate, and the like as a main component of the monomer unit. Of these, the acrylic acid ester polymer rubbers containing butyl acrylate as a main component and polymer rubbers containing butadiene as a main component are preferable.

The rubber particles may contain two or more types of rubbers. These rubbers may be uniformly mixed or may be layered. Examples of the rubber particles including layered rubbers may include particles in which the layers form a core-shell structure of the core formed of a rubber elastic component and a hard resin layer (shell). Examples of the rubber elastic component in the above-mentioned core may include a rubber elastic component obtained by grafting alkyl acrylate such as butyl acrylate and styrene. Examples of the hard resin layer (shell) may include a hard resin layer formed of a copolymer of alkyl acrylate and one or both of polymethyl methacrylate and methyl methacrylate.

The number average particle diameter of the rubber particles is preferably 0.05 μm or more, and more preferably 0.1 μm or more, and is preferably 0.3 μm or less, and more preferably 0.25 μm or less. When the number average particle diameter falls within the above-mentioned range, appropriate irregularities can be formed on the surface of the protective layer to improve the slidability of the phase difference film.

The amount of the rubber particles with respect to 100 parts by weight of the (meth)acrylic polymer is preferably 5 parts by weight or more, and is preferably 50 parts by weight or less. When the amount of the rubber particles falls within the above-mentioned range, the impact resistance of the phase difference film can be enhanced, to thereby improve handleability.

The (meth)acrylic resin may contain a component other than the (meth)acrylic polymer and the rubber particles, as long as the effects of the present invention are not significantly impaired. For example, an optional polymer other than the (meth)acrylic polymer may be contained. However, the amount of the optional polymer is preferably small from the viewpoint of significantly achieving advantages of the present invention. For example, the specific amount of the optional polymer with respect to 100 parts by weight of the (meth)acrylic polymer, is preferably 10 parts by weight or less, more preferably 5 parts by weight or less, and further preferably 3 parts by weight or less. Particularly preferably, no optional polymer is contained.

The (meth)acrylic resin may contain, for example, an additive. Examples of the additive may include the same additives as those that may be contained in the blend resin p1. As the additive, one type thereof may be used alone, and two or more types thereof may also be used in combination at any ratio. The amount of the additive may be appropriately set within the range in which the effects of the present invention are not significantly impaired.

The glass transition temperature of the (meth)acrylic resin is preferably 90° C. or higher, more preferably 95° C. or higher, and particularly preferably 100° C. or higher, and is preferably 145° C. or lower, more preferably 140° C. or lower, and particularly preferably 135° C. or lower. When the glass transition temperature of the (meth)acrylic resin is equal to or higher than the lower limit value of the above-mentioned range, blocking of resin pellets during drying at high temperature can be suppressed, so that contamination of the resin pellets with water can be prevented. Further, when the glass transition temperature of the (meth)acrylic resin is equal to or lower than the upper limit value, the temperature for molding by melt molding method can be lowered, so that contamination of the phase difference film with impurities can be prevented.

The method for producing the phase difference film which includes the layer formed of the blend resin p1 and which may be used as the λ/2 plate or the λ/4 plate is not particularly limited. The phase difference film including the layer formed of the blend resin p1 may be produced by, for example, a production method including: (a) a first step of preparing a pre-stretch film including a layer formed of the blend resin p1; and (b) a second step of stretching the prepared pre-stretch film to express a desired phase difference in the layer formed of the blend resin p1.

In (a) the first step, a pre-stretch film including a layer formed of the blend resin p1 is prepared. The pre-stretch film may be produced by, for example, a film production method such as a melt molding method and a solution casting method. More specific examples of the melt molding method may include an extrusion molding method, a press molding method, an inflation molding method, an injection molding method, a blow molding method, and a stretch molding method. Of these methods, the extrusion molding method, the inflation molding method, and the press molding method are preferable in order to obtain the phase difference film excellent in mechanical strength and surface precision. Among these, the extrusion molding method is particularly preferable since the pre-stretch film can be produced efficiently and simply.

For example, when the pre-stretch film is produced as a multilayer film including two or more layers, such as the pre-stretch film including the layer formed of the blend resin p1 and the protective layer, the methods therefor may include: co-extrusion molding methods such as a co-extrusion T-die method, a co-extrusion inflation method, and a co-extrusion lamination method; film lamination molding methods such as dry lamination; and coating molding methods such as coating a certain layer with a resin solution which constitutes a layer other than the certain layer. Of these, a co-extrusion molding method is preferable from the viewpoints of obtaining favorable production efficiency and preventing a volatile component such as a solvent from remaining in the pre-stretch film. Among the co-extrusion molding methods, a co-extrusion T-die method is preferable. Furthermore, the co-extrusion T-die method is performed in a feedblock system and a multi-manifold system, and the multi-manifold system is further preferable since fluctuations in the film thickness can be reduced.

The pre-stretch film is usually obtained as a long-length resin film. When the pre-stretch film is prepared as a long-length resin film, the λ/2 plate and the λ/4 plate formed of the phase difference film obtained by stretching the pre-stretch film as well as the circularly polarizing plate as a product can be produced as a long-length film. In a production line, production steps may be performed while the long-length film is continuously conveyed in its lengthwise direction. As a result, upon production of the phase difference film, a part or all of each production step can be performed in-line, so that the production can be performed simply and efficiently.

The preparation of the pre-stretch film in (a) the first step is followed by (b) the second step for stretching the resulting pre-stretch film. The stretching in (b) the second step usually causes expression of a desired phase difference in the layer formed of the blend resin p1. Therefore, a desired phase difference film to be used as the λ/2 plate or the λ/4 plate can be obtained as a stretched film.

As the stretching method in (b) the second step, any suitable method may be appropriately employed in accordance with optical characteristics which are desired to be expressed by stretching. Examples of the stretching method may include a method of uniaxial stretching in a lengthwise direction using a difference in peripheral speed between rolls (longitudinal uniaxial stretching); a method of uniaxial stretching in the width direction using a tenter stretching machine (transverse uniaxial stretching); a method of sequentially performing longitudinal uniaxial stretching and transverse uniaxial stretching (sequential biaxial stretching); and a method of stretching the pre-stretch film in a diagonal direction (diagonal stretching). The stretching may be performed once, and may also be performed twice or more. Two or more of the above-mentioned stretching methods may be performed in combination.

Of these stretching methods, uniaxial stretching for stretching only in one direction is preferable. The uniaxial stretching can enhance uniaxial properties of the phase difference film. Here, the uniaxial properties refers to a capability of expressing optical characteristics close to those of a film obtained by stretching in one direction. The NZ factor expressed when a layer formed of a resin having a positive intrinsic birefringence value is stretched tends to be closer to 1.0 as the uniaxial properties of the stretched film are higher. The NZ factor expressed when a layer formed of a resin having a negative intrinsic birefringence value is stretched tends to be closer to 0.0 as the uniaxial properties of the stretched film are higher. Therefore, since an NZ factor suitable for the λ/2 plate and the λ/4 plate may be achieved easily in the phase difference film having high uniaxial properties, the ability of reducing reflection of outside light in the tilt direction of the circularly polarizing plate including the phase difference film as the λ/2 plate or the λ/4 plate may be easily enhanced.

The stretching direction in (b) the second step may be set in accordance with the desired direction of the slow axis to be expressed by stretching. In particular, when the pre-stretch film is a long-length film, the stretching direction is preferably a diagonal direction. Specifically, stretching is preferably performed in the direction forming an angle of 15°±5° or 75°±5° with respect to the lengthwise direction of the pre-stretch film. By performing stretching in a diagonal direction in this manner, the slow axis can be expressed in the diagonal direction of the phase difference film. Therefore, the slow axis can be easily expressed in a diagonal direction such as in the direction forming an angle of 15°±5° with respect to the lengthwise direction of the obtained phase difference film and in the direction forming an angle of 75°±5° with respect to the lengthwise direction of the obtained phase difference film. As a result, by performing stretching in a diagonal direction, the λ/2 plate and the λ/4 plate can be easily produced as desired. When the long-length λ/2 plate and the long-length λ/4 plate each having their slow axes in the direction forming an angle of 15°±5° or 75°±5° with respect to the lengthwise direction are bonded to the long-length polarizing film having its absorption axis in the lengthwise direction, the directions of the optical axes of the respective layers can be appropriately adjusted by allowing the lengthwise directions of the λ/2 plate, the λ/4 plate, and the polarizing film to be parallel to one another. Therefore, the circularly polarizing plate according to the present invention can be easily produced.

The stretching ratio is preferably 1.2 times or more, more preferably 1.3 times or more, and particularly preferably 1.5 times or more, and is preferably 8.0 times or less, more preferably 6.0 times or less, and particularly preferably 5.0 times or less. When the stretching ratio in (b) the second step falls within the above-mentioned range, the phase difference film having desired optical characteristics can be obtained as a stretched film.

The stretching temperature in (b) the second step is preferably "$Tg_{p1}-20°$ C." or higher, and more preferably "$Tg_{p1}-5°$ C." or higher, and is preferably "$Tg_{p1}+20°$ C." or lower, and more preferably "$Tg_{p1}+10°$ C." or lower. Here, $Tg_{p1}$ indicates the glass transition temperature of the blend resin p1. When the stretching temperature falls within the above-mentioned range, orientation of molecules contained in the layer formed of the blend resin p1 can be stably effected. Therefore, the phase difference film having desired optical characteristics can be easily obtained as a stretched film.

By performing the stretching treatment in (b) the second step, the phase difference film including the layer formed of the blend resin p1 and having a desired phase difference can be obtained as a stretched film. This phase difference film may be used as it is as the λ/2 plate or the λ/4 plate. When the phase difference film includes an optional layer (such as a protective layer) other than the layer formed of the blend resin p1, (c) a third step for peeling the optional layer may be performed as necessary. For example, the stretching in (b) the second step does not usually cause expression of a phase difference in the above-described protective layer formed of the (meth)acrylic resin. Therefore, by isolating the protective layer from the phase difference film, the phase difference film can be thinned without impairing the desired phase difference.

Furthermore, when the phase difference film including the layer formed of the blend resin p1 is produced, a step other than the above-mentioned steps may be further performed.

For example, a step of performing a preheating treatment to the pre-stretch film may be performed before stretching. Examples of an apparatus for heating the pre-stretch film may include an oven-type heating apparatus, a radiation heating apparatus, and a warm bath for soaking in a liquid. Of these, an oven-type heating apparatus is preferable. The heating temperature in the preheating step is preferably "stretching temperature−40° C." or higher, and more preferably "stretching temperature−30° C." or higher, and is preferably "stretching temperature+20° C." or lower, and more preferably "stretching temperature+15° C." or lower. The stretching temperature means the preset temperature of the heating apparatus.

For example, a step of subjecting a fixing treatment to the obtained stretched phase difference film may be performed. The temperature in the fixing treatment is preferably room temperature or higher, and more preferably "stretching temperature−40° C." or higher, and is preferably "stretching temperature+30° C." or lower, and more preferably "stretching temperature+20° C." or lower.

[5.2. Phase Difference Film Including Layer Formed of Cyclic Olefin Resin]

The cyclic olefin resin is usually a thermoplastic resin having a positive intrinsic birefringence value. A phase difference film including a layer formed of the cyclic olefin resin may be used as the λ/4 plate, but is preferably used as the λ/2 plate. The refractive index of the phase difference film including the layer formed of the cyclic olefin resin may satisfy nz≥nx>ny, or may satisfy nx>ny≥nz. The cyclic olefin resin is excellent in mechanical characteristics, heat resistance, transparency, low hygroscopicity, size stability, and lightweight property.

The cyclic olefin resin refers to a resin containing a cyclic olefin polymer. The cyclic olefin polymer refers to a polymer of a structural unit having an alicyclic structure. The cyclic olefin polymer may be a polymer having an alicyclic structure in a main chain, a polymer having an alicyclic structure in a side chain, a polymer having an alicyclic structure in a main chain and a side chain, and a mixture of two or more types of these polymers at any ratio. Of these, the polymer having an alicyclic structure in a main chain is preferable from the viewpoint of mechanical strength and heat resistance.

Examples of the alicyclic structure may include a saturated alicyclic hydrocarbon (cycloalkane) structure and an unsaturated alicyclic hydrocarbon (cycloalkene, cycloalkyne) structure. Of these, the cycloalkane structure and the cycloalkene structure are preferable from the viewpoint of mechanical strength and heat resistance, and a cycloalkane structure is particularly preferable.

The number of carbon atoms constituting the alicyclic structure is preferably 4 or more, and more preferably 5 or more, and is preferably 30 or less, more preferably 20 or less, and particularly preferably 15 or less, per alicyclic structure. When the number of carbon atoms which constitute the alicyclic structure falls within this range, mechanical strength, heat resistance and moldability of the layer formed of the cyclic olefin resin are highly balanced.

The ratio of the structural unit having the alicyclic structure in the cyclic olefin polymer is preferably 55% by weight or more, further preferably 70% by weight or more, and particularly preferably 90% by weight or more. When the ratio of the structural unit having the alicyclic structure in the cyclic olefin polymer falls within this range, transparency and heat resistance of the layer formed of the cyclic olefin resin become favorable.

Of the cyclic olefin polymers, a cycloolefin polymer is preferable. The cycloolefin polymer is a polymer having a structure that is obtained by polymerizing a cycloolefin monomer. Further, the cycloolefin monomer is a compound having a ring structure formed of carbon atoms and also having a polymerizable carbon-carbon double bond in the ring structure. Examples of the polymerizable carbon-carbon double bond may include a carbon-carbon double bond that enables polymerization such as a ring opening polymerization. Further, examples of the ring structure of the cycloolefin monomer may include monocyclic, polycyclic, fused polycyclic, cross-linked cyclic structures, and polycyclic structures that are combinations of these structures. Of these, the polycyclic cycloolefin monomer is preferable from the viewpoint of highly balancing characteristics such as dielectric property and heat resistance of the obtained polymer.

Preferable examples of the cycloolefin polymers described above may include a norbornene-based polymer, a monocyclic olefin-based polymer, a cyclic conjugated diene-based polymer, and hydrogenated products thereof. Of these, the norbornene-based polymer is particularly preferable because of its favorable moldability.

Examples of the norbornene-based polymer may include a ring-opening polymer of a monomer having a norbornene structure and a hydrogenated product thereof; and an addition polymer of a monomer having a norbornene structure and a hydrogenated product thereof. Further, examples of the ring-opening polymer of a monomer having a norbornene structure may include a ring-opening homopolymer of one type of a monomer having a norbornene structure, a ring-opening copolymer of two or more types of monomers having norbornene structures, and a ring-opening copolymer of a monomer having a norbornene structure and another monomer copolymerizable therewith. Further, examples of the addition polymer of a monomer having a norbornene structure may include an addition homopolymer of one type of a monomer having a norbornene structure, an addition copolymer of two or more types of monomers having norbornene structures, and an addition copolymer of a monomer having a norbornene structure and another monomer copolymerizable therewith. Of these, a hydrogenated product of the ring-opening polymer of a monomer having a norbornene structure is particularly preferable from the viewpoint of moldability, heat resistance, low hygroscopicity, size stability, lightweight property, and the like.

Examples of the monomer having a norbornene structure may include bicyclo[2.2.1]hept-2-ene (common name: norbornene), tricyclo[4.3.0.1$^{2,5}$]deca-3,7-diene (common name: dicyclopentadiene), 7,8-benzotricyclo[4.3.0.1$^{2,5}$]deca-3-ene (common name: methanotetrahydrofluorene), tetracyclo[4.4.0.1$^{2,5}$.1$^{7,10}$]dodeca-3-ene (common name: tetracyclododecene), and derivatives of these compounds (for example, those having a substituent on the ring). Examples of the substituent herein may include an alkyl group, an alkylene group, and a polar group. Further, a plurality of such substituents may be bonded to the ring and these substituents may be the same or different from each other. As the monomer having a norbornene structure, one type thereof may be used alone, and two or more types thereof may also be used in combination at any ratio.

Examples of the polar group may include a hetero atom and an atomic group having a hetero atom. Examples of the hetero atom may include an oxygen atom, a nitrogen atom, a sulfur atom, a silicon atom, and a halogen atom. Specific examples of the polar group may include a carboxyl group, a carbonyloxycarbonyl group, an epoxy group, a hydroxyl group, an oxy group, an ester group, a silanol group, a silyl group, an amino group, an amide group, an imide group, a nitrile group, and a sulfonic acid group.

Examples of the monomer copolymerizable with the monomer having a norbornene structure through ring-opening copolymerization may include monocyclic olefins such as cyclohexene, cycloheptene, and cyclooctene, and derivatives thereof; and cyclic conjugated dienes such as cyclohexadiene and cycloheptadiene, and derivatives thereof. As the monomer copolymerizable with the monomer having a norbornene structure through ring-opening copolymerization, one type thereof may be used alone, and two or more types thereof may also be used in combination at any ratio.

The ring-opening polymer of a a monomer having a norbornene structure may be produced, for example, by polymerizing or copolymerizing such monomers in the presence of a ring-opening polymerization catalyst.

Examples of the monomer addition-copolymerizable with the monomer having a norbornene structure may include α-olefins having 2 to 20 carbon atoms such as ethylene, propylene, and 1-butene, and derivatives thereof; cycloolefins such as cyclobutene, cyclopentene, and cyclohexene, and derivatives thereof; and non-conjugated dienes such as 1,4-hexadiene, 4-methyl-1,4-hexadiene, and 5-methyl-1,4-hexadiene. Of these, the α-olefins are preferable, and ethylene is more preferable. Further, as the monomer addition-copolymerizable with the monomer having a norbornene structure, one type thereof may be used alone, and two or more types thereof may also be used in combination at any ratio.

The addition polymer of a monomer having a norbornene structure may be produced, for example, by polymerizing or copolymerizing such monomers in the presence of an addition polymerization catalyst.

A hydrogenated product of the ring-opening polymer and a hydrogenated product of the addition polymer described above may be produced, for example, by hydrogenating a carbon-carbon unsaturated bond preferably by 90% or more in a solution of the ring-opening polymer and the addition polymer in the presence of a hydrogenation catalyst containing transition metal such as nickel and palladium.

As the norbornene-based polymer, it is preferable that the polymer has an X: bicyclo [3.3.0] octane-2,4-diyl-ethylene structure and a Y: tricyclo [4.3.0.1$^{2,5}$] decane-7,9-diyl-ethylene structure as the structural units, and that the amount of these structural units is 90% by weight or more with respect to the entire structural units of the norbornene-based polymer, and the weight ratio of X to Y is 100:0 to 40:60. By using such a polymer, the layer containing the norbornene-based polymer can exhibit excellent stability in optical characteristics without having a size change over a long period of time.

Examples of the monocyclic olefin-based polymer may include an addition polymer of a monocyclic olefin-based monomer such as cyclohexene, cycloheptene, and cyclooctene.

Examples of the cyclic conjugated diene-based polymer may include: a polymer obtained by the cyclization reaction of an addition polymer of a conjugated diene-based monomer such as 1,3-butadiene, isoprene, and chloroprene; a 1,2- or 1,4-addition polymer of a cyclic conjugated diene-based monomer such as cyclopentadiene and cyclohexadiene; and hydrides thereof.

The weight average molecular weight (Mw) of the cyclic olefin polymer is preferably 10,000 or more, more preferably 15,000 or more, and particularly preferably 20,000 or more, and is preferably 100,000 or less, more preferably 80,000 or less, and particularly preferably 50,000 or less. When the weight average molecular weight is in such a range, mechanical strength and moldability of the layer formed of cyclic olefin resin are highly balanced, which is preferable. Herein, the above-mentioned weight average molecular weight is measured in terms of polyisoprene or polystyrene by a gel permeation chromatography using cyclohexane as a solvent. When the sample does not dissolve in cyclohexane in the gel permeation chromatography, toluene may be used as the solvent.

The molecular weight distribution (weight average molecular weight (Mw)/number average molecular weight (Mn)) of the cyclic olefin polymer is preferably 1.2 or more, more preferably 1.5 or more, and particularly preferably 1.8 or more, and is preferably 3.5 or less, more preferably 3.0 or less, and particularly preferably 2.7 or less. When the molecular weight distribution is equal to or higher than the lower limit value of the above-mentioned range, productivity of the polymer can be improved and a production cost can be reduced. Further, when it is equal to or lower than the upper limit value, the amount of low molecular components is reduced, whereby it is possible to increase the stability of the layer formed of the cyclic olefin resin by suppressing looseness of the film when it is exposed to a high temperature.

The ratio of the cyclic olefin polymer in the cyclic olefin resin is preferably 50% by weight to 100% by weight, more preferably 70% by weight to 100% by weight, and particularly preferably 90% by weight to 100% by weight. When the ratio of the polymer falls within the above-mentioned range, the layer formed of the cyclic olefin resin can exhibit sufficient heat resistance and transparency.

The cyclic olefin resin may contain an additive in addition to the cyclic olefin polymer. Examples of the additive may include the same additives as those that may be contained in the blend resin p1. As the additive, one type thereof may be used alone, and two or more types thereof may also be used in combination at any ratio.

The glass transition temperature of the cyclic olefin resin is preferably 100° C. or higher, more preferably 110° C. or higher, and particularly preferably 120° C. or higher, and is preferably 190° C. or lower, more preferably 180° C. or lower, and particularly preferably 170° C. or lower. When the glass transition temperature of the cyclic olefin resin is equal to or higher than the above-mentioned lower limit value within the range, it is possible to enhance durability of the layer formed of the cyclic olefin resin under a high temperature environment. When it is equal to or lower than the upper limit value, a stretching process can be easily performed.

The absolute value of photoelastic coefficient of the cyclic olefin resin is preferably $10\times10^{-12}$ Pa$^{-1}$ or less, more preferably $7\times10^{-12}$ Pa$^{-1}$ or less, and particularly preferably $4\times10^{-12}$ Pa$^{-1}$ or less. Accordingly, fluctuations in the in-plane retardation of the obtained phase difference film can be reduced. The photoelastic coefficient C is a value represented by $C=\Delta n/\sigma$, where $\Delta n$ is a birefringence and $\sigma$ is a stress.

The phase difference film including the layer formed of the cyclic olefin resin may include an optional layer other than the layer formed of the cyclic olefin resin. However, the phase difference film usually has a single-layer structure including only the layer formed of the cyclic olefin resin.

The method for producing the phase difference film including the layer formed of the cyclic olefin resin which can be used as the λ/2 plate or the λ/4 plate is not particularly limited. The phase difference film including the layer formed of the cyclic olefin resin may be produced by a production method including, for example, (d) a fourth step of preparing a pre-stretch film including the layer formed of the cyclic olefin resin, and (e) a fifth step of stretching the prepared pre-stretch film to cause expression of a desired phase difference in the layer formed of the cyclic olefin resin.

In (d) the fourth step, a pre-stretch film including the layer formed of the cyclic olefin resin is prepared. Examples of the method for producing the pre-stretch film may include, for example, a film production method similar to the film production method described in the explanation for the method for producing the pre-stretch film including the layer formed of the blend resin p1.

The pre-stretch film is usually obtained as a long-length resin film. By preparing the pre-stretch film as the long-length resin film, in production of the phase difference film, a part or all of each step can be performed in-line, so that the production can be performed simply and efficiently.

The preparation of the pre-stretch film in (d) the fourth step is followed by (e) the fifth step for stretching the prepared pre-stretch film. The stretching in (e) the fifth step usually causes expression of a desired phase difference in the layer formed of the cyclic olefin resin. Therefore, a desired phase difference film to be used as the λ/2 plate or the λ/4 plate can be obtained as a stretched film.

Examples of the stretching method in (e) the fifth step may include a stretching method similar to that for the pre-stretch film including the layer formed of the blend resin p1. The stretching may be performed once, or twice or more. Furthermore, two or more of the stretching methods may be performed in combination. Of these, uniaxial stretching of stretching only in one direction is preferable as the stretching method. This can enhance the uniaxial properties of the layer formed of the cyclic olefin resin. As a result, an NZ factor suitable for the λ/2 plate and the λ/4 plate can be easily obtained. Consequently, the ability of reducing reflection of outside light in the tilt direction of the circularly polarizing plate is enhanced easily.

The stretching direction in (e) the fifth step can be set in accordance with the desired direction of the slow axis to be expressed by stretching, and a diagonal direction is particularly preferably. Specifically, stretching is preferably performed in the direction forming an angle of 15°±5° or 75°±5° with respect to the lengthwise direction of the pre-stretch film. By performing stretching in a diagonal direction in this manner, the slow axis can be easily expressed in a desired direction, similarly to the phase difference film including the layer formed of the blend resin p1. Accordingly, the λ/2 plate and the λ/4 plate can be easily produced as desired. Furthermore, when the log-length λ/2 plate and the long-length λ/4 plate, which are obtained by stretching in a diagonal direction, are bonded with the long-length polarizing film having its absorption axis in a lengthwise direction similarly to the phase difference film including the layer formed of the blend resin p1, the directions of the optical axes of the respective layers can be appropriately adjusted by allowing the lengthwise directions of the λ/2 plate, the λ/4 plate, and the polarizing film to be parallel to one another. Therefore, the circularly polarizing plate according to the present invention can be easily produced.

The stretching ratio in (e) the fifth step is preferably 1.2 times or more, more preferably 1.3 times or more, and particularly preferably 1.5 times or more, and is preferably 8.0 times or less, more preferably 6.0 times or less, and particularly preferably 5.0 times or less. When the stretching ratio in (e) the fifth step falls within the above-mentioned range, the phase difference film having desired optical characteristics can be easily obtained as a stretched film.

The stretching temperature in (e) the fifth step is preferably "$Tg_{COP}-20°$ C." or higher, and more preferably "$Tg_{COP}-10°$ C." or higher, and is preferably "$Tg_{COP}+20°$ C." or lower, and more preferably "$Tg_{COP}+10°$ C." or lower. Here, $Tg_{COP}$ means the glass transition temperature of the cyclic olefin resin. When the stretching temperature in (e) the fifth step falls within the above-mentioned range, orientation of molecules contained in the layer formed of the cyclic olefin resin can be reliably effected. Therefore, the phase difference film having desired optical characteristics can be easily obtained as a stretched film.

By performing the stretching treatment in (e) the fifth step, the phase difference film including the layer which is formed of the cyclic olefin resin and which has a desired phase difference can be obtained as a stretched film. This phase difference film may be used as it is as the λ/2 plate or the λ/4 plate. Alternatively, still another step may be performed, similarly to the production method of the phase difference film including the layer formed of the blend resin p1.

[5.3. Physical Properties of Phase Difference Film]

The amount of the volatile component contained in the above-described phase difference film is preferably 0.1% by weight or less, more preferably 0.05% by weight or less, further preferably 0.02% by weight or less, and ideally 0. When the amount of the volatile component is reduced, the size stability of the phase difference film is improved, and changes with the lapse of time in optical characteristics such as a phase difference can be reduced. Examples of the method for reducing the amount of the volatile component may include, for example, production of the pre-stretch film by a melt molding method.

Here, the volatile component is a minute amount of substance having a molecular weight of not more than 200 contained in the film. Examples thereof may include a residual monomer and a solvent. The amount of the volatile component may be quantified as a sum of the substances having a molecular weight of not more than 200 contained in a film, by dissolving the film in chloroform and analyzing the dissolved film by using gas chromatography.

The saturated water absorption rate of the phase difference film is preferably 0.03% by weight or less, further preferably 0.02% by weight or less, particularly preferably 0.01% by weight or less, and ideally 0. When the saturated water absorption rate of the phase difference film falls within the above-mentioned range, changes with the lapse of time in optical characteristics such as a phase difference with time can be reduced.

Here, the saturated water absorption rate is a value expressed by the percentage of the weight increased when a test piece of the film is immersed in water at 23° C. for 24 hours, with respect to the weight of the film test piece before the immersion.

[6. Optional Layer]

The circularly polarizing plate according to the present invention may include an optional layer other than the polarizing film, the λ/2 plate, and the λ/4 plate within the range in which the effects of the present invention are not significantly impaired.

For example, the circularly polarizing plate according to the present invention may include a protective film layer for the prevention of scratches. For example, the circularly polarizing plate according to the present invention may include an adhesive layer or a tacky layer for adhesion of the polarizing film and the λ/2 plate as well as for adhesion of the λ/2 plate and the λ/4 plate.

[7. Physical Properties of Circularly Polarizing Plate]

The circularly polarizing plate according to the present invention can effectively reduce reflection of outside light in both a front direction and a tilt direction when it is provided on a plane which can reflect light. The circularly polarizing plate according to the present invention is useful particularly in that it can effectively reduce reflection of outside light in a wide wavelength range of a visible region.

In general, when a multilayer film including a combination of the λ/4 plate having a slow axis which forms an angle θ(λ/4) with respect to a given reference direction and the λ/2 plate having a slow axis which forms an angle θ(λ/2) with respect to the reference direction satisfies the formula C: "θ(λ/4)=2θ(λ/2)+45°", this multilayer film serves as the broadband λ/4 plate which can provide light which passes through the multilayer film with an in-plane phase difference of approximately a quarter wavelength of the wavelength of the light in a wide wavelength range (see Japanese Patent Application Laid-Open No. 2007-004120 A). In the circularly polarizing plate according to the present invention, a portion containing the λ/2 plate and the λ/4 plate can function as a broadband λ/4 plate, when the λ/2 plate and the λ/4 plate satisfy a relationship closer to that represented by the formula C. Therefore, the circularly polarizing plate according to the present invention can absorb circularly polarized light in a wide wavelength range, thereby effectively reducing reflection of outside light.

Further, in the circularly polarizing plate according to the present invention, a large refractive index nz is expressed in a thickness direction in one of the λ/2 plate and the λ/4 plate. This refractive index nz in a thickness direction can compensate apparent angle errors of the slow axis of the λ/2 plate and the slow axis of the λ/4 plate when the circularly polarizing plate is observed from a tilt direction, as described above. Therefore, the circularly polarizing plate according to the present invention can absorb circularly polarized light in a wide wavelength range, not only in a front direction but also in a tilt direction, thereby reducing reflection of outside light.

[8. Method for Producing Circularly Polarizing Plate]

The circularly polarizing plate according to the present invention may be produced by bonding the polarizing film, the λ/2 plate, and the λ/4 plate described above. In this production, the polarizing film, the λ/2 plate, and the λ/4 plate are bonded while adjusting their optical axes such that each of the slow axis of the λ/2 plate and the slow axis of the λ/4 plate forms a desired angle with respect to the absorption axis of the polarizing film. For example, each of the polarizing film, the λ/2 plate, and the λ/4 plate is cut out as a sheet piece film, and the cut-out sheet pieces of the polarizing film, the λ/2 plate, and the λ/4 plate are bonded while adjusting their optical axes, thereby to obtain the circularly polarizing plate.

Further, for example, when the circularly polarizing plate is produced by bonding a long-length polarizing film having its absorption axis in the lengthwise direction of the polarizing film, a long-length λ/2 plate having its slow axis in the direction forming an angle of 15°±5° with respect to the lengthwise direction of the λ/2 plate, and a long-length λ/4 plate having its slow axis in the direction forming an angle of 75°±5° with respect to the lengthwise direction of the λ/4 plate, the circularly polarizing plate can be produced by bonding the polarizing film, the λ/2 plate, and the λ/4 plate such that the lengthwise directions thereof become parallel to one another. In this case, the circularly polarizing plate can be produced by a roll-to-roll method. Therefore, unlike the method of bonding the polarizing film, the λ/2 plate, and the λ/4 plate which are in a sheet piece form, this circularly polarizing plate does not require a complicated step of adjusting the optical axes. Consequently, efficient production can be achieved.

For the bonding, an adhesive or a tacky agent may be used as necessary. Examples of the adhesive or the tacky agent may include acrylic-based, silicone-based, polyester-based, polyurethane-based, polyether-based, and rubber-based agents. Of these, an acrylic-based agent is preferable from the viewpoint of heat resistance and transparency.

An optional layer such as a protective layer may be peeled as necessary, before bonding the polarizing film, the λ/2 plate, and the λ/4 plate, or after bonding the polarizing film, the λ/2 plate, and the λ/4 plate.

[9. Broadband λ/4 Plate]

The broadband λ/4 plate according to the present invention is an optical member having a structure similar to a portion other than the polarizing film in the above-described circularly polarizing plate according to the present invention. Therefore, the broadband λ/4 plate of the present invention includes the λ/2 plate and the λ/4 plate having the wavelength dispersions that approximately coincide with each other as described above. The refractive index of one of the λ/2 plate and the λ/4 plate is nz≥nx>ny, and the refractive index of the other of the λ/2 plate and the λ/4 plate is nx>ny≥nz. The λ/2 plate has its slow axis in the direction forming an angle of 75°±5° with respect to a given reference direction, and the λ/4 plate has its slow axis in the direction forming an angle of 15°±5° with respect to the above-mentioned reference direction. The above-mentioned reference direction corresponds to the direction of the absorption axis of the polarizing film in the circularly polarizing plate according to the present invention.

The broadband λ/4 plate according to the present invention can have at least the following advantages.

The broadband λ/4 plate according to the present invention can provide light that passes through the broadband λ/4 plate in a front direction with an in-plane phase difference of approximately a quarter wavelength of the wavelength of the light, in a wide wavelength range.

The broadband λ/4 plate according to the present invention can provide light that passes through the broadband λ/4 plate in a tilt direction with an in-plane phase difference of approximately a quarter wavelength of the wavelength of the light, in a wide wavelength range.

Thus, the circularly polarizing plate which can reduce reflection of light in both a front direction and a tilt direction in a wide wavelength range can be achieved by combining the broadband λ/4 plate according to the present invention with the polarizing film.

The broadband λ/4 plate according to the present invention is preferably a long-length film. Since such a long-length broadband λ/4 plate can be produced by bonding a long-length λ/2 plate and a long-length λ/4 plate such that their lengthwise directions are parallel to each other, production by a roll-to-roll method can be employed to achieve efficient production. In production of such a long-length broadband λ/4 plate, the long-length λ/2 plate and the long-length λ/4 plate are preferably produced by a production method including diagonal stretching. The diagonal stretching means stretching the pre-stretch film in a diagonal direction. A long-length λ/2 plate produced by the production method including diagonal stretching easily expresses its slow axis in the direction forming an angle of 15°±5° with respect to the lengthwise direction of the λ/2 plate. A long-length λ/4 plate produced by the production method including diagonal stretching easily expresses its slow axis in the direction forming an angle of 75°±5° with respect to the lengthwise direction of the λ/4 plate. Therefore, since a complicated step of adjusting the optical axes is not required in production of the broadband λ/4 plate, efficient production can be achieved.

[10. Organic Electroluminescent Display Device]

The organic EL display device according to the present invention includes the circularly polarizing plate according to the present invention, or the broadband λ/4 plate according to the present invention.

When the organic EL display device according to the present invention includes the circularly polarizing plate, the organic EL display device usually includes the circularly polarizing plate on the display surface. Accordingly, the circularly polarizing plate can function as an antireflective film of the organic EL display device. That is, when the circularly polarizing plate is provided on the display surface of the organic EL display device such that the surface on the polarizing film side is directed to the viewing side, incident light from the outside of the device can be inhibited from reflecting in the device to be emitted outward the device. As a result, glare on the display surface of the display device can be suppressed. Specifically, only a part of linearly polarized light of the incident light from the outside of the device passes through the polarizing film, and subsequently through the λ/2 plate and the λ/4 plate, thereby to be transformed into circularly polarized light. The circularly polarized light is reflected on a constituent (such as a reflective electrode in the organic EL element) which reflects light within the display device, and thereafter passes through the λ/4 plate and the λ/2 plate again, thereby to be transformed linearly polarized light having its polarizing axis in a direction orthogonal to the polarizing axis of the incident linearly polarized light. The transformed linearly polarized light does not pass through the polarizing film. Thus, the function of antireflection is achieved.

When the organic EL display device according to the present invention includes the broadband λ/4 plate, the organic EL display device may include the broadband λ/4 plate in an appropriately selected position.

EXAMPLES

Hereinafter, the present invention will be specifically described with reference to Examples. However, the present invention is not limited to the following Examples. The present invention may be freely modified and practiced without departing from the scope of claims of the present invention and equivalents thereto.

Unless otherwise stated, the operations described below were performed under the conditions of normal temperature and normal pressure.

[Evaluation Method]

(Method for Measuring Phase Difference)

Using a phase difference measurement apparatus ("KOBRA-21ADH" manufactured by Oji Scientific Instruments, Co. Ltd.), the in-plane phase difference and the thickness-direction phase difference were measured at a plurality of points with intervals of 50 mm in the width direction of a film. Average values of the values measured at these points were calculated. These average values were defined as the in-plane phase difference and the thickness-direction phase difference of the film. In this measurement, the measurement was performed at wavelengths of 400 nm, 550 nm, and 590 nm.

(Method for Measuring NZ Factor)

Using a phase difference measurement apparatus ("KOBRA-21ADH" manufactured by Oji Scientific Instruments, Co. Ltd.), the NZ factor of a film was measured at a plurality of points with intervals of 50 mm in the width direction of the film. An average value of the values measured at these points was calculated. This average value was defined as the NZ factor of the film. In this measurement, the measurement wavelength was 590 nm.

(Visual Evaluation Method)

A mirror having a planar reflective surface was prepared. This mirror was placed such that its reflective surface would be in horizontal angle facing upward. The circularly polarizing plate was bonded on the reflective surface of this mirror such that the polarizing film side would face upward.

Thereafter, the circularly polarizing plate on the mirror was visually observed while the circularly polarizing plate was irradiated with sunlight on a sunny day. The observation was performed in both (i) the front direction at a polar angle of 0° and an azimuth angle of 0° and (ii) the tilt direction at a polar angle of 45° and an azimuth angle of 0° to 360°, of the circularly polarizing plate.

In the observation in (i) the front direction, it was evaluated whether reflection of sunlight is hardly noticeable and the circularly polarizing plate looks black.

In the observation in (ii) the tilt direction, it was evaluated whether the reflectivity and the color tone do not change with the rotation of the azimuth angle.

The above-mentioned visual evaluation was performed by five observers, and the results of all Examples and Comparative Examples were ranked. The ranked results were listed in the order according to scores, and rated as A, B, C, D, and E in the descending order from the top group within the range of the scores.

(Method for Calculating Reflectivity by Simulation)

The circularly polarizing plates produced in the Examples and Comparative Examples were modeled using, as a simulation software, "LCD Master" manufactured by SHINTEC, Inc., and the reflectivity of each of the modeled circularly polarizing plates was calculated.

The model for the simulation had a structure in which the λ/4 plate side of the circularly polarizing plate was bonded on a planar reflective surface of a mirror. Therefore, this model had a structure in which the polarizing film, the λ/2 plate, the λ/4 plate, and the mirror were provided in this order in the thickness direction.

In the above-mentioned model, the reflectivity when the circularly polarizing plate was irradiated with light from a D65 light source was calculated in (i) the front direction and (ii) the tilt direction of the circularly polarizing plate. Here, in (i) the front direction, the reflectivity in a direction at a polar angle of 0° and an azimuth angle of 0° was calculated. In (ii) the tilt direction, the reflectivity at a polar angle of 45° was calculated for every 5° in the azimuth angle direction within the azimuth angle range of 0° to 360°, and an average of the calculated values was employed as the reflectivity in the tilt direction of the modeled circularly polarizing plate.

Production Example 1. Production of Pre-Stretch Film Formed of Cycloolefin Resin A monolayer-film-molding apparatus was prepared. Pellets of a cycloolefin resin R1 ("ZEONOR 1420" manufactured by ZEON CORPORATION, glass transition temperature: 140° C.) were charged into a uniaxial extruder equipped with a double-flight-type screw of the film-molding apparatus, and melted at 260° C. The melted resin R1 was extruded from a die (surface roughness Ra of die slip: 0.1 μm) at a controlled temperature of 260° C. through a leaf-disc-shaped polymer filter having openings of 10 μm, thereby to be molded into a film shape. The molded film-shaped melted resin was cast on a casting roll adjusted to have a surface temperature of 110° C., and subsequently passed between two cooling rolls adjusted to have a surface temperature of 50° C. The resin was cooled and solidified on the casting roll, thereby to obtain a pre-stretch film. In this production, by adjusting the rotation speed of the casting roll, a pre-stretch film PF-1 having a thickness of 50 μm, a pre-stretch film PF-2 having a thickness of 100 μm, and a pre-stretch film PF-3 having a thickness of 200 μm were produced.

Production Example 2. Production of Pre-stretch Film Including Layer Formed of Blend Resin p1

(Production of Blend Resin)

70 parts by weight of syndiotactic polystyrene ("130-ZC" manufactured by Idemitsu Kosan Co., Ltd., glass transition temperature: 98° C., crystallization temperature: 140° C.)

and 30 parts by weight of poly(2,6-dimethyl-1,4-phenylene oxide) (Aldrich catalog No. 18242-7) were kneaded with a biaxial extruder, to thereby obtain pellets of a transparent resin R2. The glass transition temperature of the obtained resin R2 was 125° C.

A resin pellet R3 (glass transition temperature: 134° C.) was obtained by performing the same production method as that for the resin R2, except that the mixing ratio of the syndiotactic polystyrene and the poly(2,6-dimethyl-1,4-phenylene oxide) was 64 parts by weight and 36 parts by weight.

Furthermore, a resin pellet R4 (glass transition temperature: 141° C.) was obtained by performing the same production method as that for the resin R2, except that the mixing ratio of the syndiotactic polystyrene and the poly(2,6-dimethyl-1,4-phenylene oxide) was 60 parts by weight and 40 parts by weight.

A resin pellet R5 (glass transition temperature: 145° C.) was obtained by performing the same production method as that for the resin R2, except that the mixing ratio of the syndiotactic polystyrene and the poly(2,6-dimethyl-1,4-phenylene oxide) was 58 parts by weight and 42 parts by weight.

(Production of Pre-Stretch Film)

A film-molding apparatus for molding two types of layers by co-extrusion, which includes uniaxial extruders equipped with a double flight-type screw, (a molding apparatus of a type which is capable of molding a film having a two-layer structure with two types of resins) was prepared. Pellets of the resin R3 were charged into one of the uniaxial extruders of the above-mentioned film-molding apparatus and melted. Pellets of an impact-resistant polymethyl methacrylate resin R6 ("Sumipex HT55X" manufactured by Sumitomo Chemical Company, Limited) were charged into the other of the uniaxial extruders of the above-mentioned film-molding apparatus and melted.

The melted resin R3 at 290° C. was supplied into one manifold of a multi-manifold die (surface roughness of die slip Ra: 0.1 µm) through a leaf-disc-shaped polymer filter having openings of 10 µm. The melted resin R6 at 260° C. was supplied into the other manifold of the above-mentioned multi-manifold die through a leaf-disc-shaped polymer filter having openings of 10 µm.

The resin R3 and the resin R6 were simultaneously extruded from the multi-manifold die at 280° C. to be molded into a film shape. The molded film-shaped melted resin was cast on a casting roll adjusted to have a surface temperature of 110° C., and subsequently passed between two cooling rolls adjusted to have a surface temperature of 50° C. The resins were cooled and solidified on the casting roll, thereby to obtain a pre-stretch film including a layer formed of the resin R3 and a layer formed of the resin R6. In this production, by adjusting the rotation speed of the casting roll, a pre-stretch film PF-4 (thickness: 100 µm) including a layer formed of the resin R3 (thickness: 50 µm) and a layer formed of the resin R6 (thickness: 50 µm), and a pre-stretch film PF-5 (thickness: 200 µm) including a layer formed of the resin R3 (thickness: 100 µm) and a layer formed of the resin R6 (thickness: 100 µm) were produced.

A pre-stretch film PF-6 (thickness: 100 µm) including a layer formed of the resin R2 (thickness: 50 µm) and a layer formed of the resin R6 (thickness: 50 µm) was produced in the same method as the method for producing the pre-stretch film PF-4, except that the resin R2 was used in place of the resin R3.

A pre-stretch film PF-7 (thickness: 200 µm) including a layer formed of the resin R4 (thickness: 100 µm) and a layer formed of the resin R6 (thickness: 100 µm) was produced in the same method as the method for producing the pre-stretch film PF-4, except that the resin R4 was used in place of the resin R3.

A pre-stretch film PF-8 (thickness: 100 µm) including a layer formed of a resin R7 (thickness: 50 µm) and a layer formed of the resin R6 (thickness: 50 µm) was obtained in the same method as the method for producing the pre-stretch film PF-5, except that pellets of the resin R7 containing a styrene-maleic acid copolymer ("Dylark D332" manufactured by NOVA Chemicals, glass transition temperature: 130° C.) were used in place of the resin R3.

A pre-stretch film PF-9 (thickness: 300 µm) including a layer formed of the resin R5 (thickness: 200 µm) and a layer formed of the resin R6 (thickness: 100 µm) was produced in the same method as the method for producing the pre-stretch film PF-5, except that the resin R5 was used in place of the resin R3.

Example 1

(1-i. Production of Polarizing Film)

A long-length pre-stretch film made of a polyvinyl alcohol resin, which had been dyed with iodine, was prepared. This pre-stretch film was stretched in a lengthwise direction which forms an angle of 90° with respect to the width direction of the pre-stretch film, thereby to obtain a long-length polarizing film. This polarizing film had its absorption axis in the lengthwise direction of the polarizing film, and its transmission axis in the width direction of the polarizing film.

(1-ii. Production of λ/2 Plate)

The pre-stretch film PF-2 was subjected to free uniaxial stretching in the lengthwise direction of the pre-stretch film, thereby to obtain a λ/2 plate HF-1. In this production, the stretching temperature and the stretching ratio were adjusted such that the in-plane phase difference Re at a measurement wavelength of 590 nm would be 260 nm at a stretching ratio of 1.6 times and within a stretching temperature range of 140° C. to 150° C.

(1-iii. Production of λ/4 Plate)

The pre-stretch film PF-4 was subjected to free uniaxial stretching in the lengthwise direction of the pre-stretch film. Thereafter, the layer formed of the resin R6 was peeled off, to thereby produce a λ/4 plate QF-1 formed of the resin R3. In this production, the stretching temperature and the stretching ratio were adjusted such that the in-plane phase difference Re at a measurement wavelength of 590 nm would be 130 nm at a stretching ratio of 1.6 times and within a stretching temperature range of 134° C. to 144° C.

(1-iv. Bonding)

A transparent tacky sheet for optical use ("LUCIACS CS9621T" manufactured by Nitto Denko Corporation) was prepared as a layer of a tacky agent. With this tacky sheet, the above-mentioned polarizing film, λ/2 plate HF-1, and λ/4 plate QF-1 were bonded in this order. Consequently, a circularly polarizing plate POL-1 including the polarizing film, the tacky sheet, the λ/2 plate, the tacky sheet, and the λ/4 plate in this order was obtained. When this circularly polarizing plate POL-1 was observed from the polarizing film side, the angle θh formed counterclockwise by the slow axis of the λ/2 plate with respect to the absorption axis of the polarizing film, and the angle θq formed counterclockwise by the slow axis of the λ/4 plate with respect to the absorption axis of the polarizing film were as shown in Table 2. At the time of bonding the λ/2 plate and the λ/4 plate to the polarizing film or the tacky sheet, the λ/2 plate HF-1 and the λ/4 plate QF-1 were cut out into sheet piece films such that the direction of the slow axis of the λ/2 plate and the direction of the slow axis of the λ/4 plate with respect to the absorption axis of the polarizing film would be θh and θq, respectively. Sheet piece films were also cut out in a similar manner in the following Examples and Comparative Examples.

The circularly polarizing plate POL-1 was evaluated in the above-described methods.

Example 2

(2-i. Production of λ/2 Plate)

The pre-stretch film PF-3 was stretched in a width direction which forms an angle of 90° with respect to a lengthwise direction, using a transverse stretching machine, to thereby produce a λ/2 plate HF-2. In this production, the stretching temperature and the stretching ratio were adjusted such that the in-plane phase difference Re at a measurement wavelength of 590 nm would be 260 nm at a stretching ratio of 4.0 times and within a stretching temperature range of 140° C. to 150° C.

(2-ii. Production of λ/4 Plate)

The pre-stretch film PF-5 was stretched in a width direction which forms an angle of 90° with respect to a lengthwise direction, using a transverse stretching machine. Thereafter, the layer formed of the resin R6 was peeled off, to thereby produce a λ/4 plate QF-2 formed of the resin R3. In this production, the stretching temperature and the stretching ratio were adjusted such that the in-plane phase difference Re at a measurement wavelength of 590 nm would be 130 nm at a stretching ratio of 2.5 times and within a stretching temperature range of 134° C. to 144° C.

(2-iii. Bonding)

A circularly polarizing plate POL-2 including the polarizing film, the tacky sheet, the λ/2 plate, the tacky sheet, and the λ/4 plate in this order was obtained in the same manner as the step (1-iv. Bonding) of Example 1, except that the λ/2 plate HF-2 was used in place of the λ/2 plate HF-1, and furthermore, the λ/4 plate QF-2 was used in place of the λ/4 plate QF-1. When this circularly polarizing plate POL-2 was observed from the polarizing film side, the angle θh formed counterclockwise by the slow axis of the λ/2 plate with respect to the absorption axis of the polarizing film, and the angle θq formed counterclockwise by the slow axis of the λ/4 plate with respect to the absorption axis of the polarizing film were as shown in Table 2.

The circularly polarizing plate POL-2 was evaluated in the above-described methods.

Example 3

(3-i. Production of λ/2 Plate)

The pre-stretch film PF-5 was subjected to free uniaxial stretching in the lengthwise direction of the pre-stretch film. Thereafter, the layer formed of the resin R6 was peeled off, to thereby produce a λ/2 plate HF-3 formed of the resin R3. In this production, the stretching temperature and the stretching ratio were adjusted such that the in-plane phase difference Re at a measurement wavelength of 590 nm would be 260 nm at a stretching ratio of 1.6 times and within a stretching temperature range of 134° C. to 144° C.

(3-ii. Production of λ/4 Plate)

The pre-stretch film PF-1 was subjected to free uniaxial stretching in the lengthwise direction of the pre-stretch film, to thereby produce a λ/4 plate QF-3. In this production, the stretching temperature and the stretching ratio were adjusted such that the in-plane phase difference Re at a measurement wavelength of 590 nm would be 130 nm at a stretching ratio of 1.6 times and within a stretching temperature range of 140° C. to 150° C.

(3-iii. Bonding)

A circularly polarizing plate POL-3 including the polarizing film, the tacky sheet, the λ/2 plate, the tacky sheet, and the λ/4 plate in this order was obtained in the same manner as the step (1-iv. Bonding) of Example 1, except that the λ/2 plate HF-3 was used in place of the λ/2 plate HF-1, and furthermore, the λ/4 plate QF-3 was used in place of the λ/4 plate QF-1. When this circularly polarizing plate POL-3 was observed from the polarizing film side, the angle θh formed counterclockwise by the slow axis of the λ/2 plate with respect to the absorption axis of the polarizing film, and the angle θq formed counterclockwise by the slow axis of the λ/4 plate with respect to the absorption axis of the polarizing film were as shown in Table 2.

The circularly polarizing plate POL-3 was evaluated in the above-described methods.

Example 4

(4-i. Production of λ/4 Plate)

The pre-stretch film PF-6 was subjected to free uniaxial stretching in the lengthwise direction of the pre-stretch film. Thereafter, the layer formed of the resin R6 was peeled off, to thereby produce a λ/4 plate QF-4 formed of the resin R2. In this production, the stretching temperature and the stretching ratio were adjusted such that the in-plane phase difference Re at a measurement wavelength of 590 nm would be 129 nm at a stretching ratio of 1.6 times and within a stretching temperature range of 125° C. to 135° C.

(4-ii. Bonding)

A circularly polarizing plate POL-4 including the polarizing film, the tacky sheet, the λ/2 plate, the tacky sheet, and the λ/4 plate in this order was obtained in the same manner as the step (1-iv. Bonding) of Example 1, except that the λ/4 plate QF-4 was used in place of the λ/4 plate QF-1. When this circularly polarizing plate POL-4 was observed from the polarizing film side, the angle θh formed counterclockwise by the slow axis of the λ/2 plate with respect to the absorption axis of the polarizing film, and the angle θq formed counterclockwise by the slow axis of the λ/4 plate with respect to the absorption axis of the polarizing film were as shown in Table 2.

The circularly polarizing plate POL-4 was evaluated in the above-described methods.

Example 5

(5-i. Production of λ/4 Plate)

The pre-stretch film PF-7 was subjected to free uniaxial stretching in the lengthwise direction of the pre-stretch film. Thereafter, the layer formed of the resin R6 was peeled off, to thereby produce a λ/4 plate QF-5 formed of the resin R4. In this production, the stretching temperature and the stretching ratio were adjusted such that the in-plane phase difference Re at a measurement wavelength of 590 nm would be 132 nm at a stretching ratio of 1.6 times and within a stretching temperature range of 141° C. to 151° C.

(5-ii. Bonding)

A circularly polarizing plate POL-5 including the polarizing film, the tacky sheet, the λ/2 plate, the tacky sheet, and the λ/4 plate in this order was obtained in the same manner as the step (1-iv. Bonding) of Example 1, except that the λ/4 plate QF-5 was used in place of the λ/4 plate QF-1. When this circularly polarizing plate POL-5 was observed from the polarizing film side, the angle θh formed counterclockwise by the slow axis of the λ/2 plate with respect to the absorption axis of the polarizing film, and the angle θq formed counterclockwise by the slow axis of the λ/4 plate with respect to the absorption axis of the polarizing film were as shown in Table 2.

The circularly polarizing plate POL-5 was evaluated in the above-described methods.

Example 6

(6-i. Bonding)

A circularly polarizing plate POL-6 including the polarizing film, the tacky sheet, the λ/2 plate, the tacky sheet, and the λ/4 plate in this order was obtained in the same manner as the step (1-iv. Bonding) of Example 1, except that the λ/2 plate HF-2 was used in place of the λ/2 plate HF-1. When this circularly polarizing plate POL-6 was observed from the polarizing film side, the angle θh formed counterclockwise by the slow axis of the λ/2 plate with respect to the absorption axis of the polarizing film, and the angle θq formed counterclockwise by the slow axis of the λ/4 plate with respect to the absorption axis of the polarizing film were as shown in Table 2.

The circularly polarizing plate POL-6 was evaluated in the above-described methods.

Example 7

(7-i. Production of λ/2 Plate)

The pre-stretch film PF-3 was stretched in a width direction which forms an angle of 90° with respect to a lengthwise direction, using a transverse stretching machine, to thereby obtain a λ/2 plate HF-4. In this production, the stretching temperature and the stretching ratio were adjusted such that the in-plane phase difference Re at a measurement wavelength of 590 nm would be 260 nm at a stretching ratio of 3.0 times and within a stretching temperature range of 140° C. to 150° C.

(7-ii. Bonding)

A circularly polarizing plate POL-7 including the polarizing film, the tacky sheet, the λ/2 plate, the tacky sheet, and the λ/4 plate in this order was obtained in the same manner as the step (1-iv. Bonding) of Example 1, except that the λ/2 plate HF-4 was used in place of the λ/2 plate HF-1. When this circularly polarizing plate POL-7 was observed from the polarizing film side, the angle θh formed counterclockwise by the slow axis of the λ/2 plate with respect to the absorption axis of the polarizing film, and the angle θq formed counterclockwise by the slow axis of the λ/4 plate with respect to the absorption axis of the polarizing film were as shown in Table 2.

The circularly polarizing plate POL-7 was evaluated in the above-described methods.

Example 8

(8-i. Bonding)

A circularly polarizing plate POL-8 including the polarizing film, the tacky sheet, the λ/2 plate, the tacky sheet, and the λ/4 plate in this order was obtained in the same manner as the step (1-iv. Bonding) of Example 1, except that the λ/4 plate QF-2 was used in place of the λ/4 plate QF-1. When this circularly polarizing plate POL-8 was observed from the polarizing film side, the angle θh formed counterclockwise by the slow axis of the λ/2 plate with respect to the absorption axis of the polarizing film, and the angle θq formed counterclockwise by the slow axis of the λ/4 plate with respect to the absorption axis of the polarizing film were as shown in Table 2.

The circularly polarizing plate POL-8 was evaluated in the above-described methods.

Example 9

(9-i. Production of λ/4 Plate)

The pre-stretch film PF-5 was stretched in a width direction which forms an angle of 90° with respect to a lengthwise direction, using a transverse stretching machine. Thereafter, the layer formed of the resin R6 was peeled off, to thereby produce a λ/4 plate QF-6 formed of the resin R3. In this production, the stretching temperature and the stretching ratio were adjusted such that the in-plane phase difference Re at a measurement wavelength of 590 nm would be 130 nm at a stretching ratio of 2.0 times and within a stretching temperature range of 134° C. to 144° C.

(9-ii. Bonding)

A circularly polarizing plate POL-9 including the polarizing film, the tacky sheet, the λ/2 plate, the tacky sheet, and the λ/4 plate in this order was obtained in the same manner as the step (1-iv. Bonding) of Example 1, except that the λ/4 plate QF-6 was used in place of the λ/4 plate QF-1. When this circularly polarizing plate POL-9 was observed from the polarizing film side, the angle θh formed counterclockwise by the slow axis of the λ/2 plate with respect to the absorption axis of the polarizing film, and the angle θq formed counterclockwise by the slow axis of the λ/4 plate with respect to the absorption axis of the polarizing film were as shown in Table 2.

The circularly polarizing plate POL-9 was evaluated in the above-described methods.

Comparative Example 1

(10-i. Bonding)

A circularly polarizing plate POL-10 including the polarizing film, the tacky sheet, the λ/2 plate, the tacky sheet, and the λ/4 plate in this order was obtained in the same manner as the step (1-iv. Bonding) of Example 1, except that the λ/4 plate QF-3 was used in place of the λ/4 plate QF-1. When this circularly polarizing plate POL-10 was observed from the polarizing film side, the angle θh formed counterclockwise by the slow axis of the λ/2 plate with respect to the absorption axis of the polarizing film, and the angle θq formed counterclockwise by the slow axis of the λ/4 plate with respect to the absorption axis of the polarizing film were as shown in Table 2.

The circularly polarizing plate POL-10 was evaluated in the above-described methods.

Comparative Example 2

(11-i. Production of λ/4 Plate)

The pre-stretch film PF-8 was subjected to free uniaxial stretching in the lengthwise direction of the pre-stretch film. Thereafter, the layer formed of the resin R6 was peeled off, to thereby produce a λ/4 plate QF-7 formed of the resin R7. In this production, the stretching temperature and the stretching ratio were adjusted such that the in-plane phase difference Re at a measurement wavelength of 590 nm would be 128 nm at a stretching ratio of 1.6 times and within a stretching temperature range of 130° C. to 140° C.

(11-ii. Bonding)

A circularly polarizing plate POL-11 including the polarizing film, the tacky sheet, the λ/2 plate, the tacky sheet, and the λ/4 plate in this order was obtained in the same manner as the step (1-iv. Bonding) of Example 1, except that the λ/4 plate QF-7 was used in place of the λ/4 plate QF-1. When this circularly polarizing plate POL-11 was observed from the polarizing film side, the angle θh formed counterclockwise by the slow axis of the λ/2 plate with respect to the absorption axis of the polarizing film, and the angle θq formed counterclockwise by the slow axis of the λ/4 plate with respect to the absorption axis of the polarizing film were as shown in Table 2.

The circularly polarizing plate POL-11 was evaluated in the above-described methods.

Comparative Example 3

(12-i. 4/λ Plate)

An optically isotropic roll-like cycloolefin resin film having a thickness of 25 µm, a width of 500 mm, and a length of 500 m was prepared as a transparent supporting body.

A diluted solution of steroid-modified polyamic acid was continuously applied onto the transparent supporting body to form a vertically oriented film having a thickness of 0.5 µm. Next, the vertically oriented film was continuously subjected to a rubbing treatment in the direction forming an angle of 45° with respect to the lengthwise direction of the transparent supporting body.

A coating liquid having the composition shown in Table 1 described below was continuously applied onto the above-mentioned vertically oriented film using a bar coater, thereby to form a film of the coating liquid. This film of the coating liquid was dried, and heated to cause orientation of a discotic liquid crystal molecules. Thereafter, the film was irradiated with ultraviolet rays to fix the discotic liquid crystal molecule, to thereby obtain an optically anisotropic layer having a thickness of 1.7 µm. Consequently, a λ/4 plate QF-8 including the transparent supporting body and the optically anisotropic layer was obtained. In this production, the discotic liquid crystal molecules were aligned with homegeneous orientation so as to have an optical axis (director) in the direction forming an angle of 45° with respect to the lengthwise direction of the transparent supporting body. The λ/4 plate QF-8 had its slow axis in the direction to be orthogonal to its optical axis (director) (that is, the direction forming an angle of 45° with respect to the lengthwise direction of the transparent supporting body).

TABLE 1

Component of liquid crystal compositions

| Component | Amount |
| --- | --- |
| Discotic liquid crystal molecule (A) described below | 32.6 wt % |
| Cellulose acetate butyrate | 0.7 wt % |
| Modified trimethylolpropane triacrylate (B) described below | 3.2 wt % |
| Sensitizer (C) described below | 0.4 wt % |
| Photopolymerization initiator (D) described below | 1.1 wt % |
| Methyl ethyl ketone | 62.0 wt % |

TABLE 1-continued

Component of liquid crystal compositions

| Component | Amount |
| --- | --- |

Discotic liquid crystal molecule (A)

[Structure: triphenylene core with six R substituents]

R: —O—CO—⟨phenyl⟩—O—(CH$_2$)$_4$—O—CO—CH=CH$_2$

Modified trimethylolpropane triacrylate (B)

CH$_2$—(OC$_2$H$_4$)$_l$—O—CO—CH=CH$_2$
|
C$_2$H$_5$—C—CH$_2$—(OC$_2$H$_4$)$_m$—O—CO—CH=CH$_2$
|
CH$_2$—(OC$_2$H$_4$)$_n$—O—CO—CH=CH$_2$ $l + m + n = 3.5$

Sensitizer (C)

[Xanthone structure with two C$_2$H$_5$ substituents]

Photopolymerization initiator (D)

H$_3$CS—⟨phenyl⟩—CO—C(CH$_3$)$_2$—N⟨morpholine⟩

(12-ii. Bonding)

A circularly polarizing plate POL-12 including the polarizing film, the tacky sheet, the λ/2 plate, the tacky sheet, and the λ/4 plate in this order was obtained in the same manner as the step (1-iv. Bonding) of Example 1, except that the λ/4 plate QF-8 was used in place of the λ/4 plate QF-1. When this circularly polarizing plate POL-12 was observed from the polarizing film side, the angle θh formed counterclockwise by the slow axis of the λ/2 plate with respect to the absorption axis of the polarizing film, and the angle θq formed counterclockwise by the slow axis of the λ/4 plate with respect to the absorption axis of the polarizing film were as shown in Table 2.

The circularly polarizing plate POL-12 was evaluated in the above-described methods.

Comparative Example 4

(13-i. Production of λ/4 Plate)

The pre-stretch film PF-9 was subjected to free uniaxial stretching in the lengthwise direction of the pre-stretch film. Thereafter, the layer formed of the resin R6 was peeled off, to thereby produce a λ/4 plate QF-9 formed of the resin R5. In this production, the stretching temperature and the stretching ratio were adjusted such that the in-plane phase difference Re at a measurement wavelength of 590 nm would be 134 nm at a stretching ratio of 1.6 times and within a stretching temperature range of 145° C. to 155° C.

(13-ii. Bonding)

A circularly polarizing plate POL-13 including the polarizing film, the tacky sheet, the λ/2 plate, the tacky sheet, and the λ/4 plate in this order was obtained in the same manner as the step (1-iv. Bonding) of Example 1, except that the λ/4 plate QF-9 was used in place of the λ/4 plate QF-1. When this circularly polarizing plate POL-13 was observed from the polarizing film side, the angle θh formed counterclockwise by the slow axis of the λ/2 plate with respect to the absorption axis of the polarizing film and the angle θq formed counterclockwise by the slow axis of the λ/4 plate with respect to the absorption axis of the polarizing film were as shown in Table 2.

The circularly polarizing plate POL-13 was evaluated in the above-described methods.

Comparative Example 5

(14-i. Bonding)

A circularly polarizing plate POL-14 including the polarizing film, the tacky sheet, the λ/2 plate, the tacky sheet, and the λ/4 plate in this order was obtained in the same manner as the step (1-iv. Bonding) of Example 1, except that the angle θh formed counterclockwise by the slow axis of the λ/2 plate with respect to the absorption axis of the polarizing film and the angle θq formed counterclockwise by the slow axis of the λ/4 plate with respect to the absorption axis of the polarizing film were changed as shown in Table 2 described below. θh and θq of this circularly polarizing plate were as shown in Table 2.

The circularly polarizing plate POL-14 was evaluated in the above-described methods.

Comparative Example 6

(15-i. Bonding)

A circularly polarizing plate POL-15 including the polarizing film, the tacky sheet, the λ/2 plate, the tacky sheet, and the λ/4 plate in this order was obtained in the same manner as the step (1-iv. Bonding) of Example 1, except that the angle θh formed counterclockwise by the slow axis of the λ/2 plate with respect to the absorption axis of the polarizing film, and the angle θq formed counterclockwise by the slow axis of the λ/4 plate with respect to the absorption axis of the polarizing film were changed as shown in Table 2 described below. θh and θq of this circularly polarizing plate were as shown in Table 2.

The circularly polarizing plate POL-15 was evaluated in the above-described methods.

[Results]

The configurations of the above-described Examples and Comparative Examples are shown in Table 2, and the results are shown in Table 3. In the following tables, meanings of the abbreviations are as follows.

COP: Cyclic olefin resin

PPE: Poly(2,6-dimethyl-1,4-phenylene oxide)

SPS: Syndiotactic polystyrene

SMA: Styrene-maleic acid copolymer resin

Discotic LC: Discotic liquid crystal molecule

Re: In-plane phase difference at measurement wavelength of 590 nm

Rth: Thickness-direction phase difference at measurement wavelength of 590 nm

θh: Angle formed counterclockwise by slow axis of λ/2 plate with respect to absorption axis of polarizing film, when circularly polarizing plate was observed from polarizing film side θq: Angle formed counterclockwise by slow axis of λ/4 plate with respect to absorption axis of polarizing film, when circularly polarizing plate was observed from polarizing film side NZh: NZ factor of λ/2 plate NZq: NZ factor of λ/4 plate

TABLE 2

[Configurations of Examples and Comparative Examples]

| | | λ/2 plate | | | | | λ/4 Plate | | | | | | Difference in wavelength dispersion |
|---|---|---|---|---|---|---|---|---|---|---|---|---|---|
| | Resin | Wavelength dispersion | Re (nm) | Rth (nm) | θh (°) | NZh | Resin | Wavelength dispersion | Re (nm) | Rth (nm) | θq (°) | NZq | |
| Example | | | | | | | | | | | | | |
| 1 | COP | 1.009 | 260 | 130 | 15.0 | 1.00 | PPE/SPS = 36/64 | 1.009 | 130 | −65 | 75.0 | 0.00 | 0.00 |
| 2 | COP | 1.009 | 260 | 156 | 15.0 | 1.10 | PPE/SPS = 36/64 | 1.009 | 130 | −104 | 75.0 | −0.30 | 0.00 |
| 3 | PPE/SPS = 36/64 | 1.009 | 260 | −130 | 15.0 | 0.00 | COP | 1.009 | 130 | 65 | 75.0 | 1.00 | 0.00 |
| 4 | COP | 1.009 | 260 | 130 | 15.0 | 1.00 | PPE/SPS = 30/70 | 1.073 | 129 | −64 | 75.0 | 0.00 | −0.06 |
| 5 | COP | 1.009 | 260 | 130 | 15.0 | 1.00 | PPE/SPS = 40/60 | 0.910 | 132 | −66 | 75.0 | 0.00 | 0.10 |
| 6 | COP | 1.009 | 260 | 156 | 15.0 | 1.10 | PPE/SPS = 36/64 | 1.009 | 130 | −65 | 75.0 | 0.00 | 0.00 |
| 7 | COP | 1.009 | 260 | 182 | 15.0 | 1.20 | PPE/SPS = 36/64 | 1.009 | 130 | −65 | 75.0 | 0.00 | 0.00 |
| 8 | COP | 1.009 | 260 | 130 | 15.0 | 1.00 | PPE/SPS = 36/64 | 1.009 | 130 | −104 | 75.0 | −0.30 | 0.00 |
| 9 | COP | 1.009 | 260 | 130 | 15.0 | 1.00 | PPE/SPS = 36/64 | 1.009 | 130 | −117 | 75.0 | −0.40 | 0.00 |

TABLE 2-continued

[Configurations of Examples and Comparative Examples]

| | λ/2 plate | | | | | | λ/4 Plate | | | | | | Difference in wavelength dispersion |
|---|---|---|---|---|---|---|---|---|---|---|---|---|---|
| | Resin | Wavelength dispersion | Re (nm) | Rth (nm) | θh (°) | NZh | Resin | Wavelength dispersion | Re (nm) | Rth (nm) | θq (°) | NZq | |
| Comparative Example | | | | | | | | | | | | | |
| 1 | COP | 1.009 | 260 | 130 | 15.0 | 1.00 | COP | 1.009 | 130 | 65 | 75.0 | 1.00 | 0.00 |
| 2 | COP | 1.009 | 260 | 130 | 15.0 | 1.00 | SMA | 1.125 | 128 | −64 | 75.0 | 0.00 | −0.12 |
| 3 | COP | 1.009 | 260 | 130 | 15.0 | 1.00 | Discotic LC | 1.332 | 125 | −63 | 75.0 | 0.00 | −0.32 |
| 4 | COP | 1.009 | 260 | 130 | 15.0 | 1.00 | PPE/SPS = 42/58 | 0.829 | 134 | −67 | 75.0 | 0.00 | 0.18 |
| 5 | COP | 1.009 | 260 | 130 | 22.5 | 1.00 | PPE/SPS = 36/64 | 1.009 | 130 | −65 | 90.0 | 0.00 | 0.00 |
| 6 | COP | 1.009 | 260 | 130 | 7.5 | 1.00 | PPE/SPS = 36/64 | 1.009 | 130 | −65 | 60.0 | 0.00 | 0.00 |

TABLE 3 results of Examples and Comparative Examples

| | Front direction | | Tilt Direction | |
|---|---|---|---|---|
| | Reflectivity | Visual observation | Reflectivity | Visual observation |
| Example | | | | |
| 1 | 0.04% | A | 1.05% | A |
| 2 | 0.04% | A | 1.88% | A |
| 3 | 0.04% | A | 1.71% | A |
| 4 | 0.05% | A | 1.06% | A |
| 5 | 0.06% | B | 1.06% | A |
| 6 | 0.04% | A | 1.34% | A |
| 7 | 0.04% | A | 1.76% | A |
| 8 | 0.04% | A | 1.73% | A |
| 9 | 0.04% | A | 2.06% | B |
| Comparative Example | | | | |
| 1 | 0.04% | A | 2.59% | D |
| 2 | 0.08% | C | 1.09% | A |
| 3 | 0.18% | E | 1.21% | A |
| 4 | 0.11% | D | 1.11% | A |
| 5 | 0.14% | E | 1.21% | A |
| 6 | 0.15% | E | 1.13% | A |

DESCRIPTION OF NUMERALS 100 circularly polarizing plate
110 polarizing film
111 absorption axis of polarizing film
112 axis as projected line of absorption axis of polarizing film on the surface of λ/2 plate
113 axis as projected line of absorption axis of polarizing film on the surface of λ/4 plate
120 λ/2 plate
121 slow axis of λ/2 plate
130 λ/4 plate
131 slow axis of λ/4 plate
140 broadband λ/4 plate

The invention claimed is:

1. A circularly polarizing plate comprising:
a polarizing film;
a λ/2 plate having a slow axis in a direction forming an angle of 15°±5° with respect to an absorption axis of the polarizing film; and
a λ/4 plate having a slow axis in a direction forming an angle of 75°±5° with respect to the absorption axis of the polarizing film, which are provided in this order, wherein
a wavelength dispersion of the λ/2 plate and a wavelength dispersion of the λ/4 plate approximately coincide with each other, and
when a refractive index in an in-plane slow axis direction is represented by nx, a refractive index in an in-place fast axis direction is represented by ny, and a refractive index in a thickness direction is represented by nz, a refractive index of one of the λ/2 plate and the λ/4 plate is nz≥nx>ny, and a refractive index of the other of the λ/2 plate and the λ/4 plate is nx>ny≥nz.

2. The circularly polarizing plate according to claim 1, satisfying the following formula (A):

|Reh(400)/Reh(550)−Req(400)/Req(550)|<1.00 wherein Reh(400) is an in-plane phase difference of the λ/2 plate at a wavelength of 400 nm,
Reh(550) is an in-plane phase difference of the λ/2 plate at a wavelength of 550 nm,
Req(400) is an in-plane phase difference of the λ/4 plate at a wavelength of 400 nm, and
Req(550) is an in-plane phase difference of the λ/4 plate at a wavelength of 550 nm.

3. The circularly polarizing plate according to claim 1, wherein
an NZ factor of one of the λ/2 plate and the λ/4 plate is −0.5 to 0.0, and
an NZ factor of the other of the λ/2 plate and the λ/4 plate is 1.0 to 1.3.

4. The circularly polarizing plate according to claim 1, wherein one of the λ/2 plate and the λ/4 plate includes a layer formed of a resin containing polyphenylene ether and a polystyrene-based polymer having a syndiotactic structure.

5. The circularly polarizing plate according to claim 4, wherein a weight ratio of the polyphenylene ether to the polystyrene-based polymer is larger than 30/70 and smaller than 40/60.

6. The circularly polarizing plate according to claim 1, wherein one of the λ/2 plate and the λ/4 plate includes a layer formed of a resin containing a cyclic olefin polymer.

7. The circularly polarizing plate according to claim 1, wherein
the circularly polarizing plate is a long-length film, and
an absorption axis of the polarizing film is in a lengthwise direction of the circularly polarizing plate.

8. An organic electroluminescent display device comprising the circularly polarizing plate according to claim 1.

9. A broadband λ/4 plate comprising:
a λ/2 plate having a slow axis in a direction forming an angle of 75°±5° with respect to a reference direction; and
a λ/4 plate having a slow axis in a direction forming an angle of 15°±5° with respect to the reference direction, wherein
a wavelength dispersion of the λ/2 plate and a wavelength dispersion of the λ/4 plate approximately coincide with each other, and
when a refractive index in an in-plane slow axis direction is represented by nx, a refractive index in an in-place fast axis direction is represented by ny, and a refractive index in a thickness direction is represented by nz, a refractive index of one of the λ/2 plate and the λ/4 plate is nz≥nx>ny, and a refractive index of the other of the λ/2 plate and the λ/4 plate is nx>ny≥nz.

10. The broadband λ/4 plate according to claim 9, wherein
the broadband λ/4 plate is a long-length film, and
the λ/2 plate and the λ/4 plate are produced by a production method including diagonal stretching.

11. An organic electroluminescent display device comprising the broadband λ/4 plate according to claim 9.

* * * * *